US012210921B2

(12) United States Patent
Jang et al.

(10) Patent No.: US 12,210,921 B2
(45) Date of Patent: Jan. 28, 2025

(54) BI-DIRECTIONAL VOLTAGE CONVERTER OF SMART CARD AND SMART CARD INCLUDING THE SAME

(71) Applicant: SAMSUNG ELECTRONICS CO., LTD., Suwon-si (KR)

(72) Inventors: Eunsang Jang, Hwaseong-si (KR); Junho Kim, Seoul (KR); Jisoo Chang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 18/103,731

(22) Filed: Jan. 31, 2023

(65) Prior Publication Data

US 2023/0177299 A1 Jun. 8, 2023

Related U.S. Application Data

(62) Division of application No. 17/227,711, filed on Apr. 12, 2021, now Pat. No. 11,599,760.

(30) Foreign Application Priority Data

Jun. 25, 2020 (KR) .................. 10-2020-0077866
Aug. 26, 2020 (KR) .................. 10-2020-0108035

(51) Int. Cl.
*G06K 19/07* (2006.01)
*H02M 1/00* (2006.01)
(Continued)

(52) U.S. Cl.
CPC ..... *G06K 19/0715* (2013.01); *G06K 19/0723* (2013.01); *H02M 1/0041* (2021.05);
(Continued)

(58) Field of Classification Search
CPC .......... G06K 19/0715; G06K 19/0723; G06K 19/0701; G06K 19/07749; H02M 1/0041;
(Continued)

(56) References Cited

U.S. PATENT DOCUMENTS 5,612,861 A 3/1997 Zhong
6,922,096 B2 7/2005 Cernea
(Continued)

FOREIGN PATENT DOCUMENTS

CN 204304779 U 4/2015
CN 111027369 A 4/2020
(Continued)

OTHER PUBLICATIONS

European Search Report Dated Nov. 22, 2021 From European Patent Office for European Patent Application No. 21177968.1.
(Continued)

*Primary Examiner* — Sibin Chen
(74) *Attorney, Agent, or Firm* — Fish & Richardson P.C.

(57) ABSTRACT

A bi-directional voltage converter of a smart card includes switching elements connected between an input node and an output node and a start-up transistors whose channel width over channel length is smaller than a channel width over channel length of the switching element. The bi-directional voltage converter stores a driving voltage applied to an output node in a storage capacitor during a booting operation and provides the voltage stored in the storage capacitor to an input node. The bi-directional voltage converter may boost another driving voltage at the input node step-wisely and may perform bi-directional voltage converting with reduced occupied area and high efficiency.

12 Claims, 24 Drawing Sheets

(51) Int. Cl.
*H02M 3/07* (2006.01)
*H03K 17/0412* (2006.01)
*H03K 17/16* (2006.01)

(52) U.S. Cl.
CPC ........ *H02M 3/07* (2013.01); *H03K 17/04123* (2013.01); *H03K 17/161* (2013.01)

(58) Field of Classification Search
CPC ............ H02M 1/10; H02M 1/36; H02M 1/08; H02M 1/088; H02M 3/07; H02M 3/158; G06Q 20/341; G06Q 20/40145
See application file for complete search history.

(56) References Cited

U.S. PATENT DOCUMENTS

| | | | |
|---|---|---|---|
| 7,504,805 B2 | 3/2009 | Nishida | |
| 8,294,435 B2 * | 10/2012 | Nishimura | H02M 3/1584 323/225 |
| 11,068,764 B2 * | 7/2021 | Yeh | G06K 19/042 |
| 2008/0036529 A1 | 2/2008 | Ishiyama | |
| 2010/0141331 A1 | 6/2010 | Chaoui | |
| 2013/0278322 A1 | 10/2013 | Choung et al. | |
| 2019/0036450 A1 | 1/2019 | Szczeszynski | |
| 2019/0146569 A1 * | 5/2019 | Nge | G06F 1/305 713/320 |
| 2020/0356745 A1 * | 11/2020 | Yeh | G06K 19/0718 |

FOREIGN PATENT DOCUMENTS

| | | |
|---|---|---|
| KR | 295677 A | 10/2000 |
| KR | 1372825 B1 | 3/2014 |
| KR | 1597056 B1 | 2/2016 |
| KR | 1829346 A | 12/2017 |

OTHER PUBLICATIONS

Anonymous, "Low-droupout regulator—Wikipedia", Mar. 31, 2020 (Mar. 31, 2020), XP055883867.
European Patent Office for European Patent Application No. 21177968.1 dated Feb. 4, 2022.

* cited by examiner

FIG 16
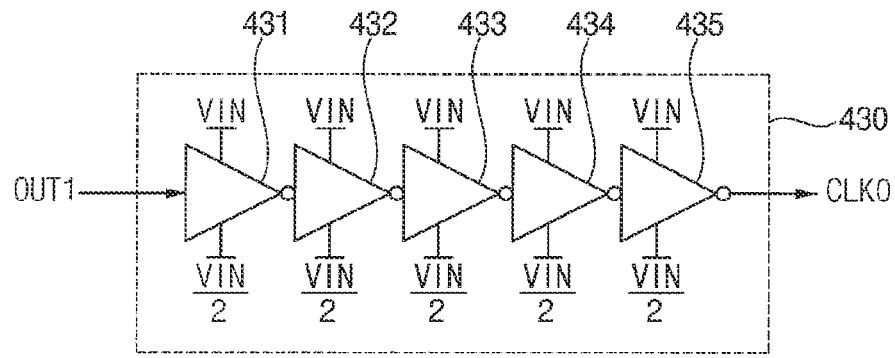
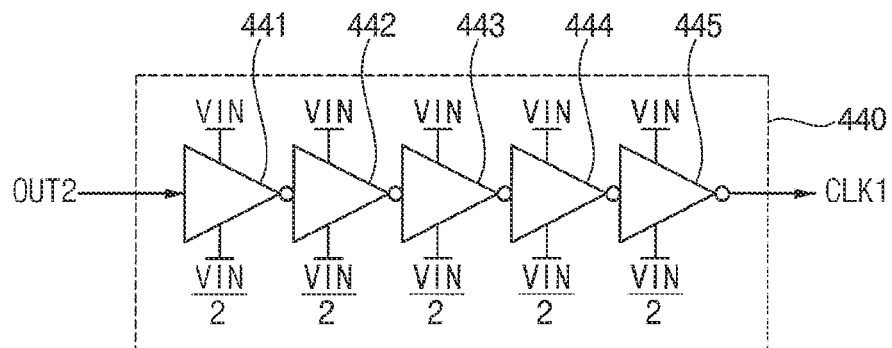
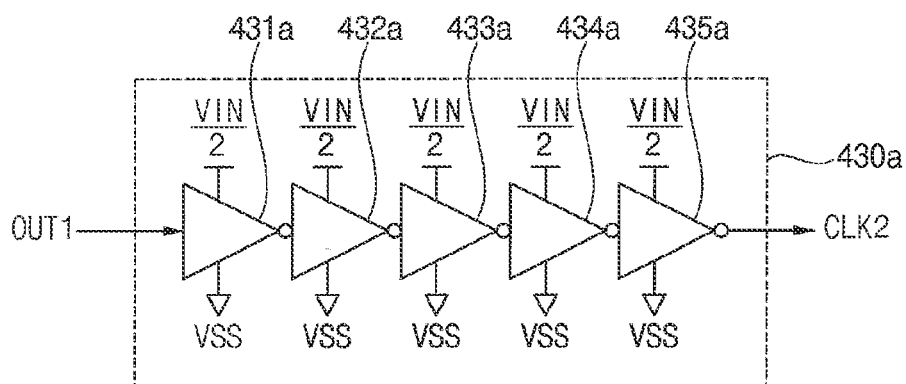
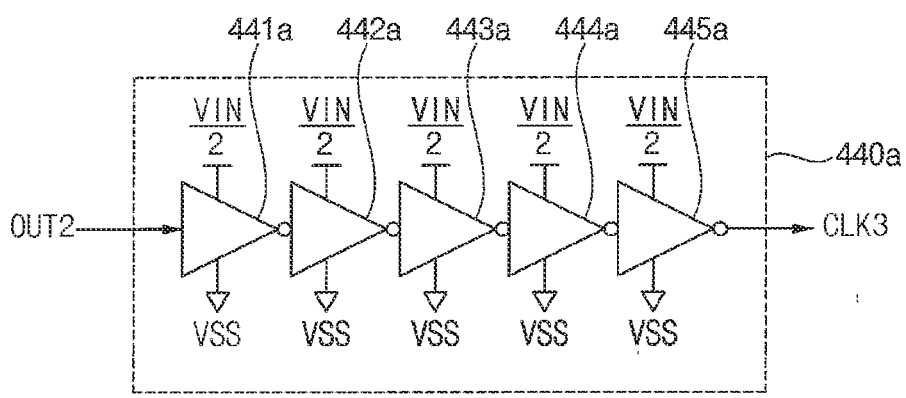

| STATE | PDL | PDH |
|---|---|---|
| VIN<VOUT | 0 | 1 |
| VOUT<VIN<2*VOUT | 0 | 1 |
| STEADY STATE | 0 | 0 |

BI-DIRECTIONAL VOLTAGE CONVERTER OF SMART CARD AND SMART CARD INCLUDING THE SAME

CROSS-REFERENCE TO RELATED APPLICATION

This is a Divisional of U.S. application Ser. No. 17/227,711, filed Apr. 12, 2021, and a claim of priority under 35 U.S.C. § 119 is made to Korean Patent Application No. 10-2020-0077866, filed on Jun. 25, 2020 and to Korean Patent Application No. 10-2020-0108035, filed on Aug. 26, 2020, in the Korean Intellectual Property Office, the disclosures of which are incorporated by reference in their entirety herein.

BACKGROUND

1. Technical Field

Embodiments of the disclosure relate to smart cards. In particular, the disclosures relate to bi-directional voltage converters of smart cards performing fingerprint authentication, and smart cards including the same.

2. Description of the Related Art

Smart card, also called chip cards or integrated circuit (IC) cards, may be classified into contact cards, contactless cards, and combi-cards (or hybrid cards) depending on how the device is used. A contact card includes on its surface a contact terminal to which external power is supplied. A contactless card includes a non-contact type terminal, such as an antenna, that receives a radio frequency signal to generate a power supply voltage. A combi-card may operate as a contact card in a contact mode and as a contactless card in a contactless mode.

SUMMARY

Example embodiments provide a bi-directional voltage converter of a smart card, to perform fingerprint authentication, capable of performing a booting operation effectively without a charge-pump.

Example embodiments provide a smart card including a bi-directional voltage converter capable of performing a booting operation effectively without a charge-pump.

According to some example embodiments, a bi-directional voltage converter of a smart card, to perform a fingerprint authentication, includes a gate driving circuit, a switching circuit and a start-up circuit. The gate driving circuit generates first through fourth clock signals based on a first output signal, a second output signal, a first sub power-down signal and a second sub power-down signal. The first output signal and the second output signal have non-overlapping activation intervals with each other, and at least some of the first through fourth clock signals have non-overlapping activation intervals with one another. The switching circuit includes first through fourth switching elements connected in series between an input node and a ground voltage. The first through fourth switching elements are switched in response to respective one of the first through fourth clock signals and store an output voltage applied to an output node in a storage capacitor coupled between a first node and a second node, in a boosting operation. The start-up circuit includes a first start-up transistor and a second start-up transistor connected in series between the input node and the output node. The first start-up transistor and the second start-up transistor are switched in response to a first delayed clock signal and a second delayed clock signal to provide the output voltage stored in the storage capacitor to the input node in the boosting operation. The first delayed clock signal and the second delayed clock signal have non-overlapping activation intervals with each other.

According to some example embodiments, a smart card to perform a fingerprint authentication includes a matching circuit and a smart card. The matching circuit receives a voltage from an external card reader without contact to provide the received voltage as a contactless voltage. The smart card chip is coupled to the matching circuit through a first power terminal and a second power terminal. The smart card chip includes a connection terminal, an internal voltage generation circuit, a fingerprint recognition sensor and a processor. The connection terminal receives a voltage in contact with the card reader to provide a contact voltage. The internal voltage generation circuit generates a first driving voltage and a second driving voltage based on the contactless voltage in a contactless mode and generates the first driving voltage and the second driving voltage using the contact voltage based on a class according to a level of the contact voltage in a contact mode. The fingerprint recognition sensor operates based on the first driving voltage and generates a fingerprint image signal based on an input fingerprint. The internal voltage generation circuit includes a bi-directional voltage converter. The bi-directional voltage converter is connected between an input node and an output node and boosts the first driving voltage step-wisely by storing a second driving voltage applied to the output node, in a storage capacitor therein, and by providing the second driving voltage stored in the storage capacitor to the input node, in a boosting operation.

According to some example embodiments, a bi-directional voltage converter of a smart card, to perform a fingerprint authentication, includes a dead time generator, a gate driving circuit, a switching circuit, a start-up circuit and a delayed clock signal generator. The dead time generator generates a first output signal and a second output signal having non-overlapping activation intervals with each other based on a reference clock signal. The gate driving circuit generates first through fourth clock signals based on the first output signal, the second output signal, a first sub power-down signal and a second sub power-down signal. At least some of the first through fourth clock signals have non-overlapping activation intervals with one another. The switching circuit includes first through fourth switching elements connected in series between an input node and a ground voltage The first through fourth switching elements are switched in response to respective ones of the first through fourth clock signals and store an output voltage applied to an output node in a storage capacitor coupled between a first node and a second node, in a boosting operation. The start-up circuit includes a first start-up transistor and a second start-up transistor connected in series between the input node and the output node. The first start-up transistor and the second start-up transistor are switched in response to a first delayed clock signal and a second delayed clock signal to provide the output voltage stored in the storage capacitor to the input node in the boosting operation, and the first delayed clock signal and the second delayed clock signal have non-overlapping activation intervals with each other. The delayed clock generation circuit generates the first delayed clock signal and the second delayed clock signal based on the first output signal, the second output signal and the second power-down signal.

Accordingly, a bi-directional voltage converter of a smart card to perform a fingerprint authentication includes switching elements connected between an input node and an output node and start-up transistors whose channel width over channel length is smaller than a channel width over channel length of the switching element. The bi-directional voltage converter does not include a charge-pump. The bi-directional voltage converter stores the second driving voltage applied to the output node in a storage capacitor in a booting operation and provides the voltage stored in the storage capacitor to the input node. Therefore, the bi-directional switched capacitor converter may boost the first driving voltage at the input node step-wisely and may perform bi-directional voltage converting with reduced occupied area and high efficiency.

BRIEF DESCRIPTION OF THE DRAWINGS

The above and other features of the present disclosure will become more apparent by describing in detail example embodiments thereof with reference to the accompanying drawings.

Figure 4:
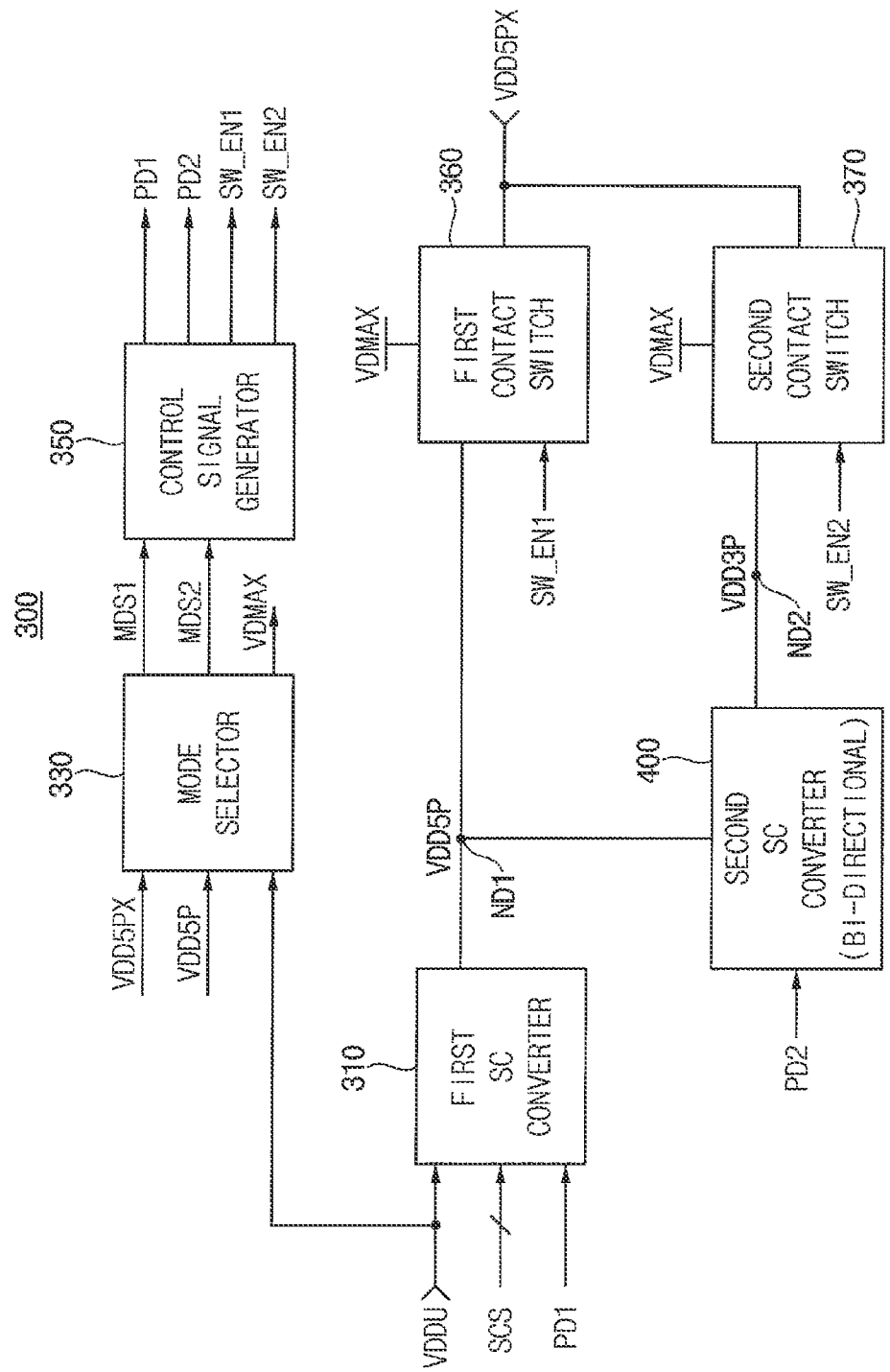
FIG. 4 is a block diagram illustrating an example of the internal voltage generation circuit in the smart card chip in FIG. 2 according to example embodiments.
Figure 11:
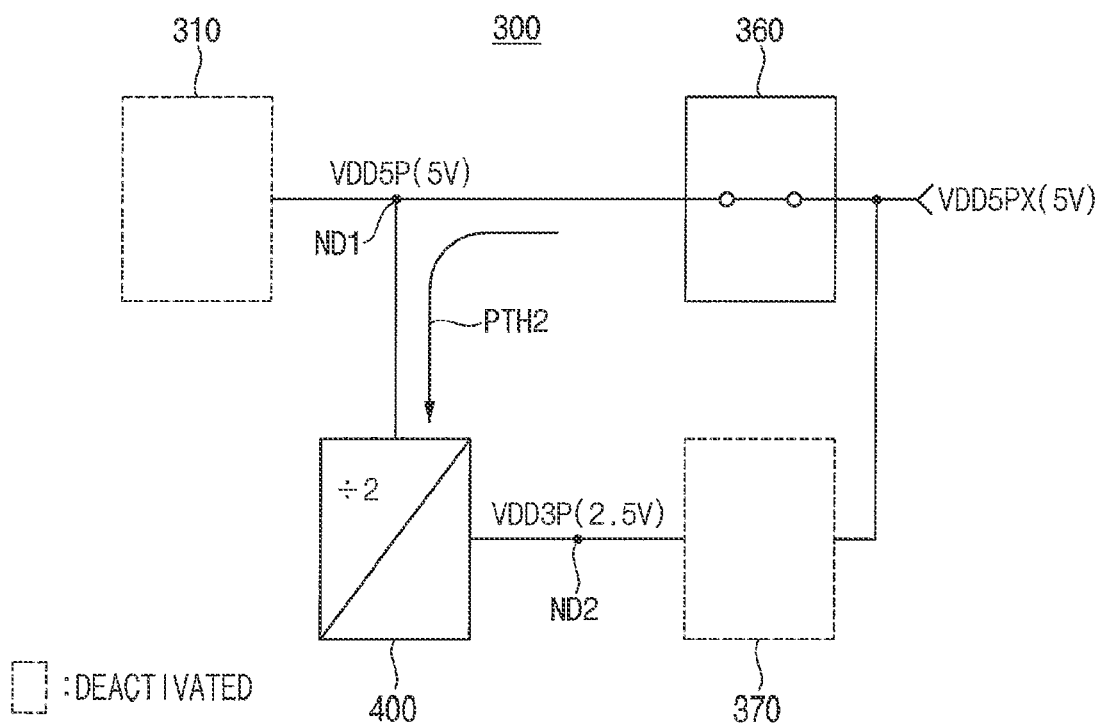
Figure 12:
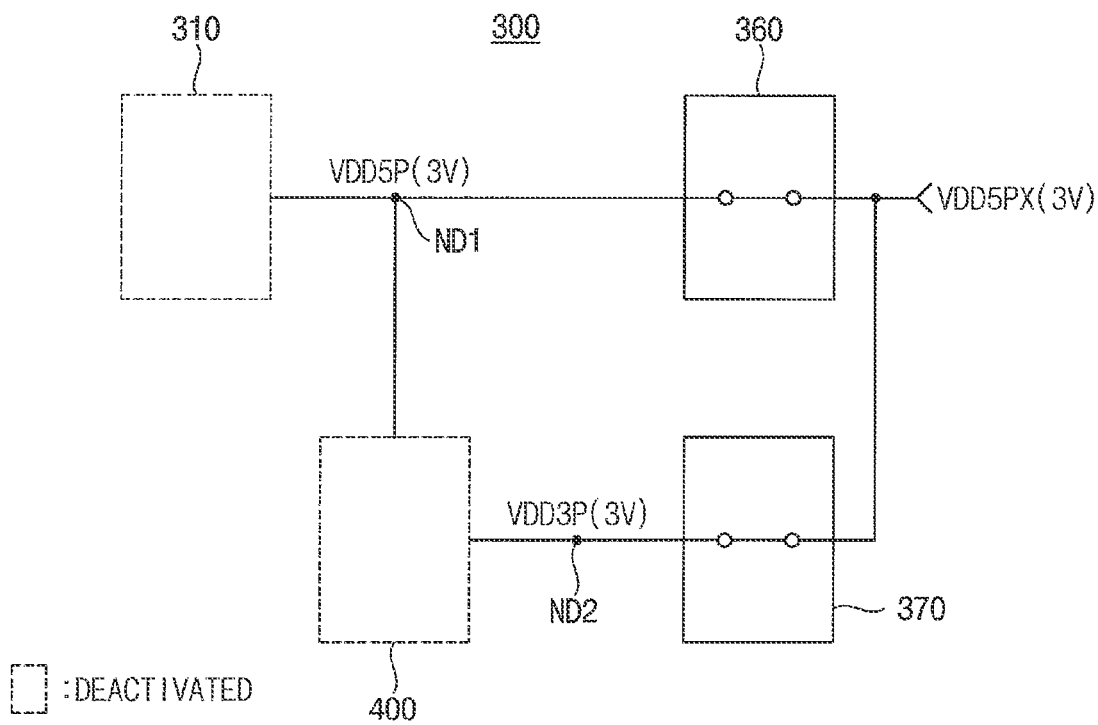
Figure 13:
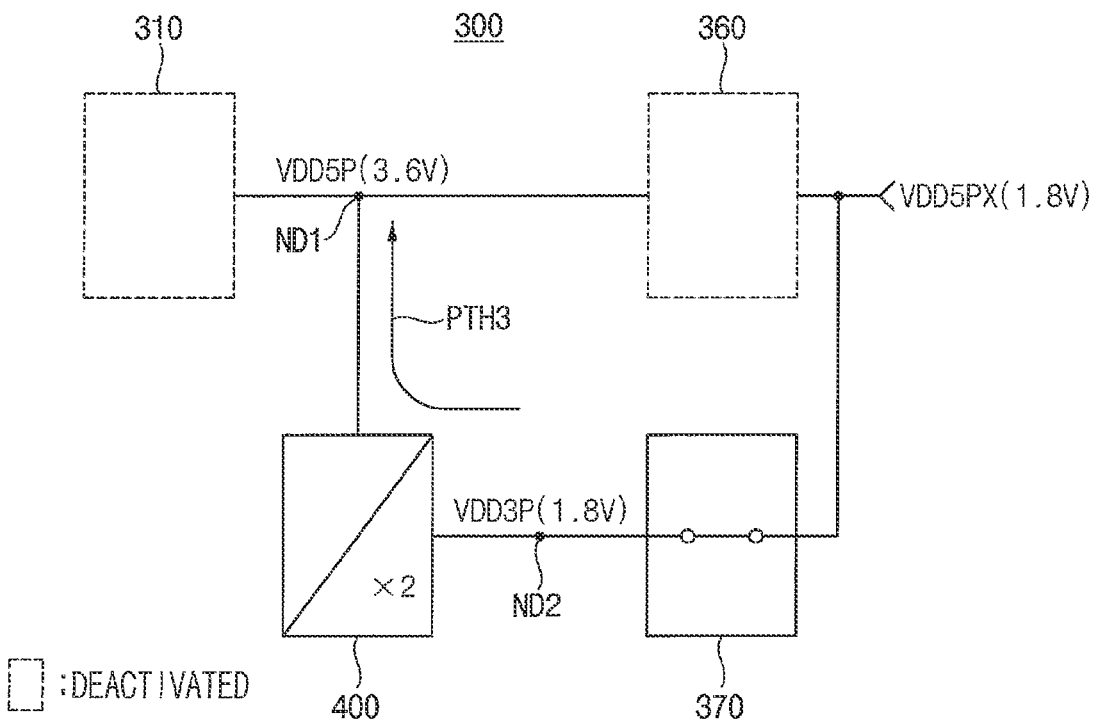

Each of FIGS. 11 through 13 illustrates a portion of the internal voltage generation circuit of FIG. 4 in the contact mode.

Figure 14:
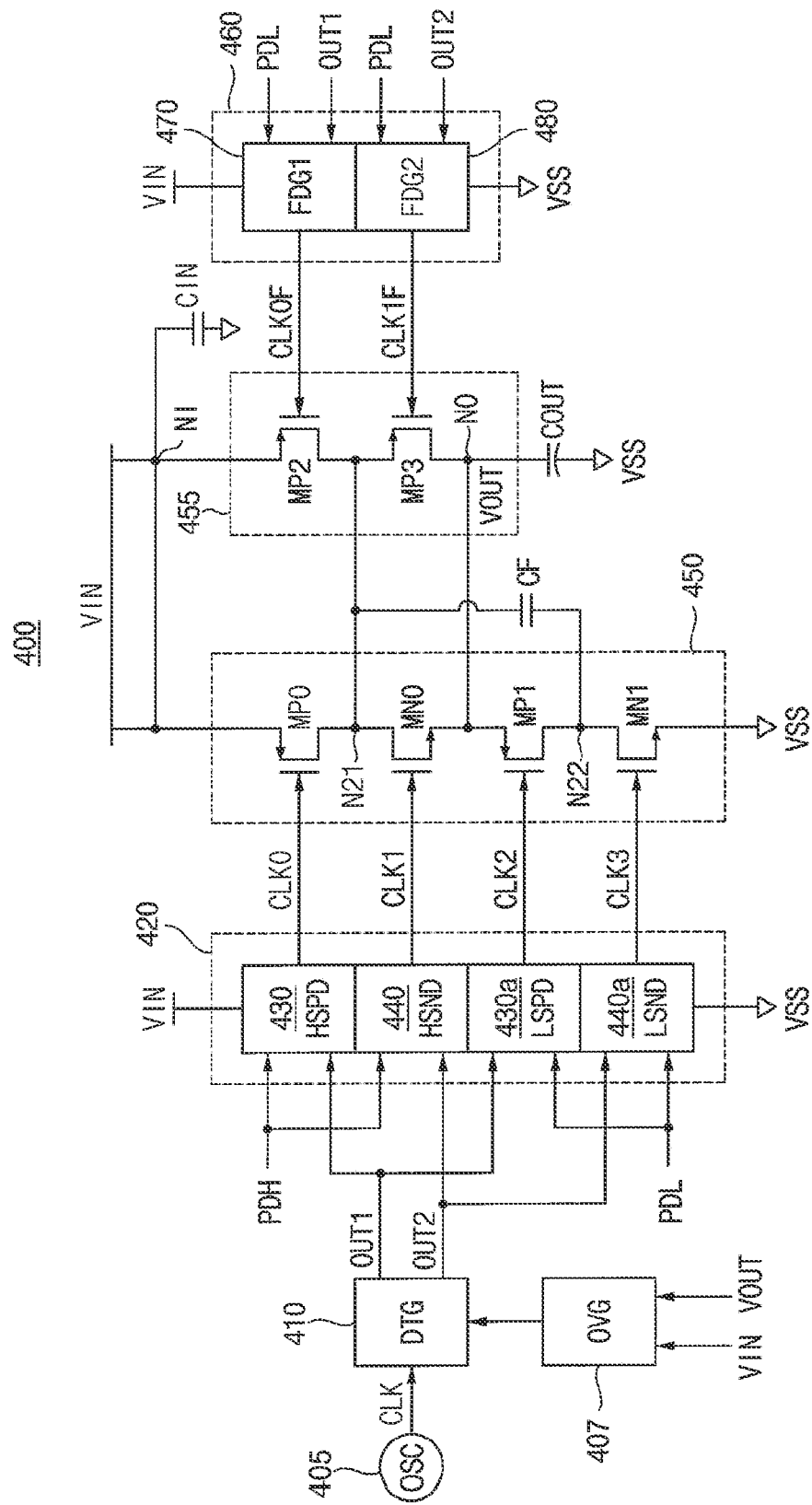

FIG. 14 is a block diagram illustrating an example of the bi-directional voltage converter in the internal voltage generation circuit of FIG. 4 according to example embodiments.

Figure 15:
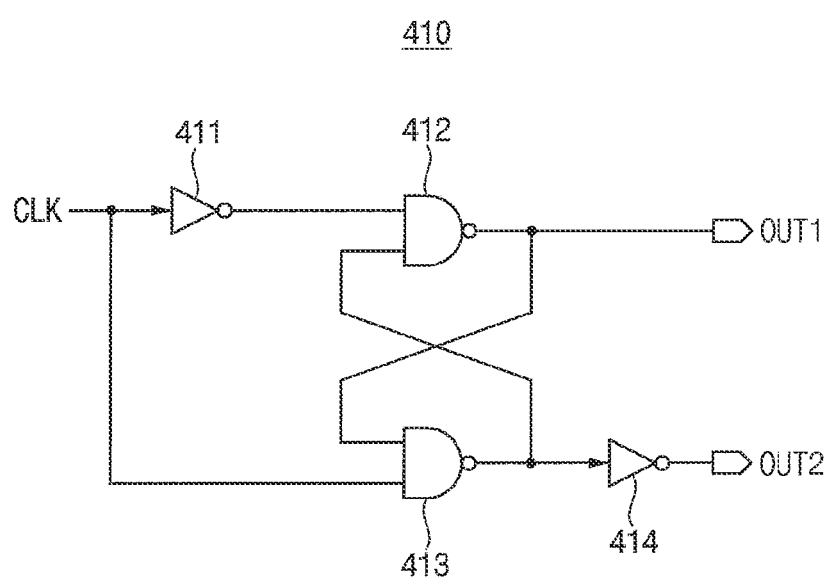

FIG. 15 is a circuit diagram illustrating an example of the dead time generator in the bi-directional voltage converter of FIG. 14 according to example embodiments.

FIG. 16 is a circuit diagram illustrating an example of the gate driving circuit in FIG. 14 according to example embodiments.

Figure 17:
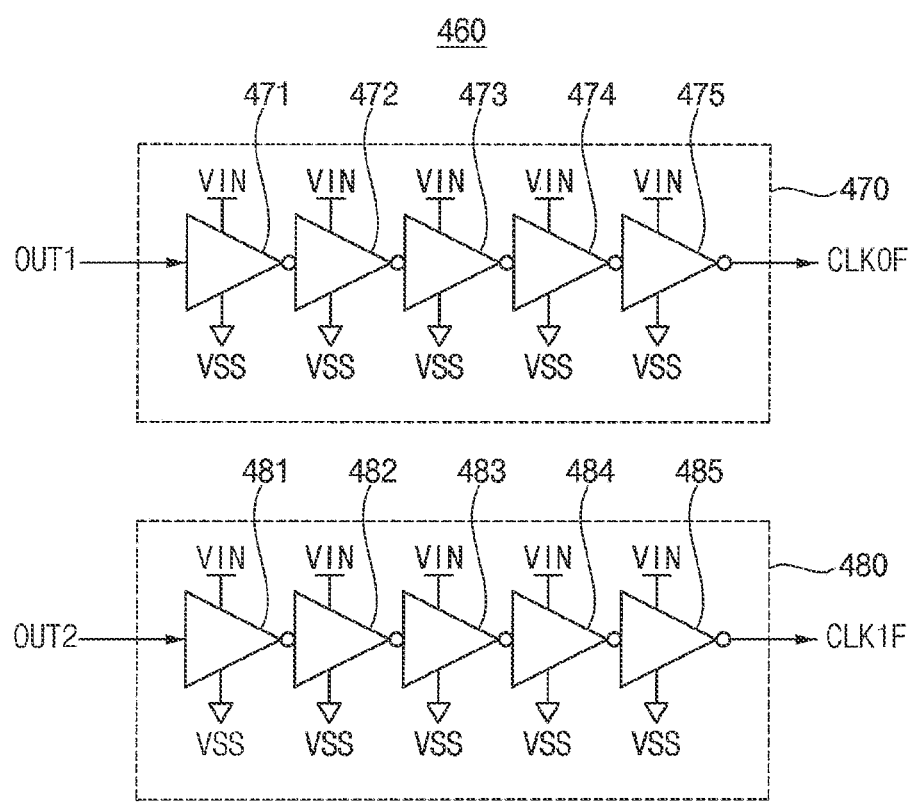

FIG. 17 is a circuit diagram illustrating an example of the delayed clock generation circuit in FIG. 14 according to example embodiments.

Figure 18:
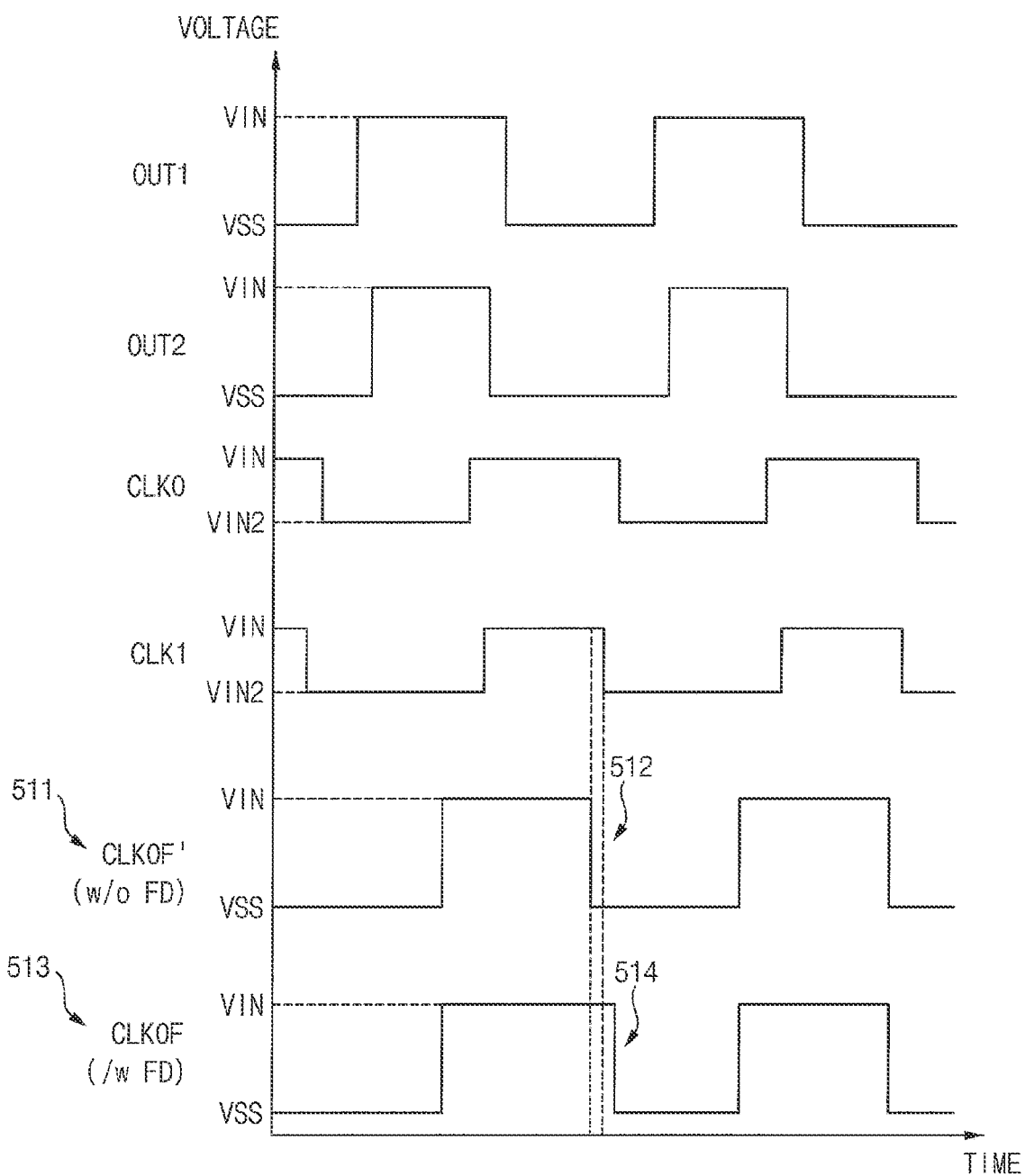

FIG. 18 is a timing diagram illustrating various signals in the bi-directional voltage converter of FIG. 14.

Figure 19:
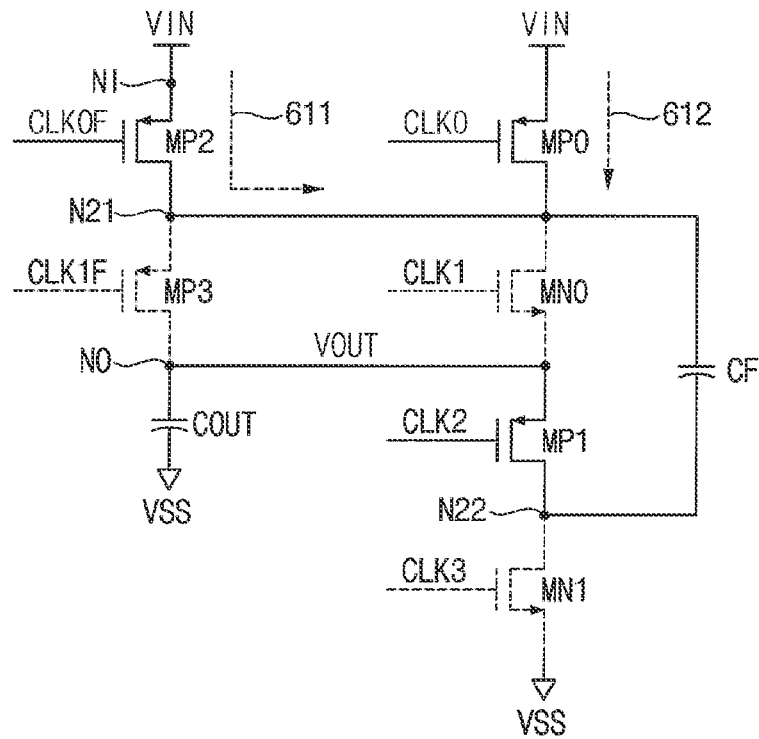
Figure 20:
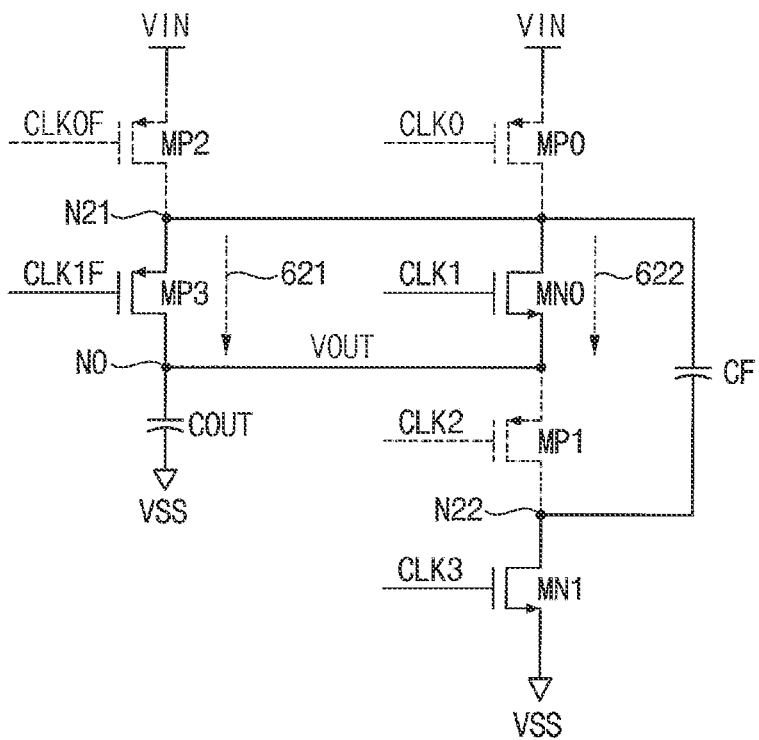

FIGS. 19 and 20 illustrate operations of the switching circuit and the start-up circuit in the bi-directional voltage converter of FIG. 14, in a first phase and a second phase of a stepping-down operation, respectively.

Figure 21:
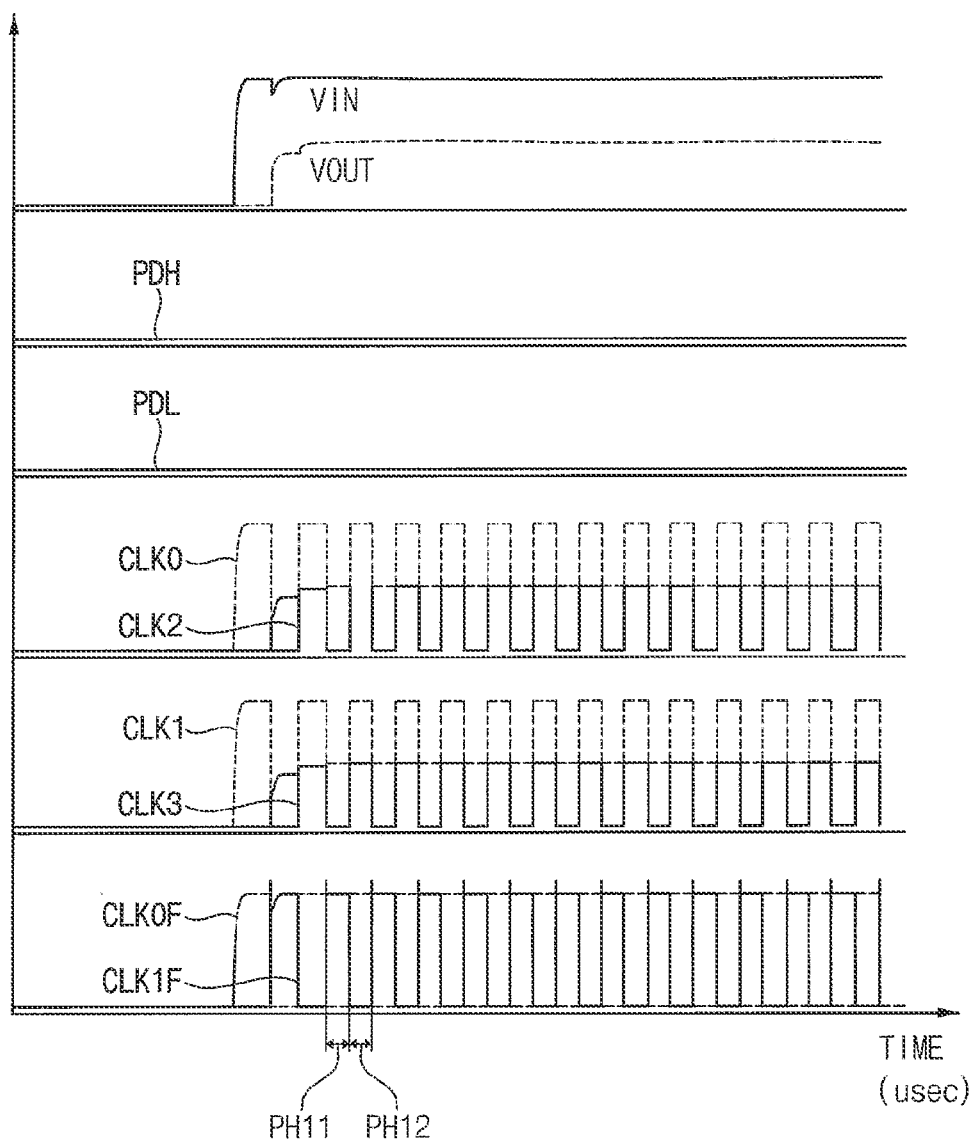

FIG. 21 illustrates various signals of the bi-directional voltage converter of FIG. 14, in the stepping-down operation.

Figure 22:
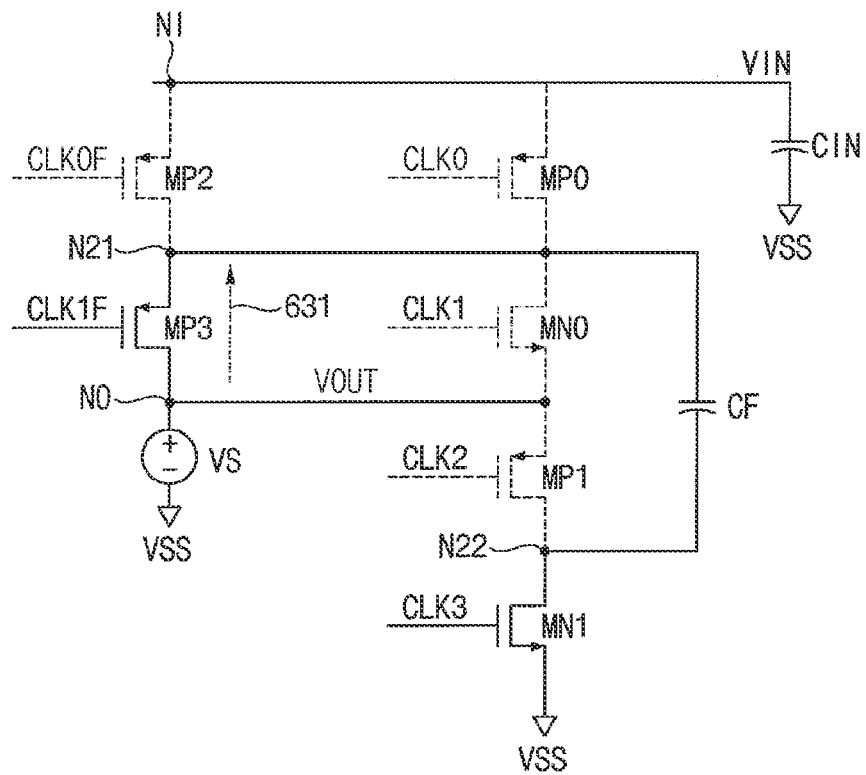
Figure 23:
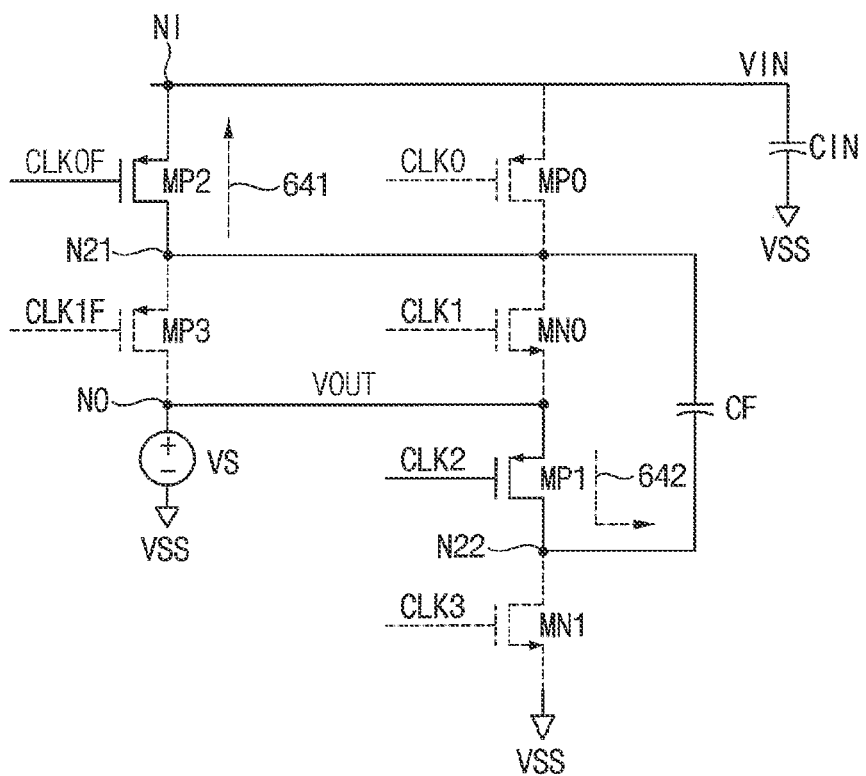

FIGS. 22 and 23 illustrate operations of the switching circuit and the start-up circuit in the bi-directional voltage converter of FIG. 14, in a first phase and a second phase during the first interval of the boosting operation, respectively.

Figure 24:
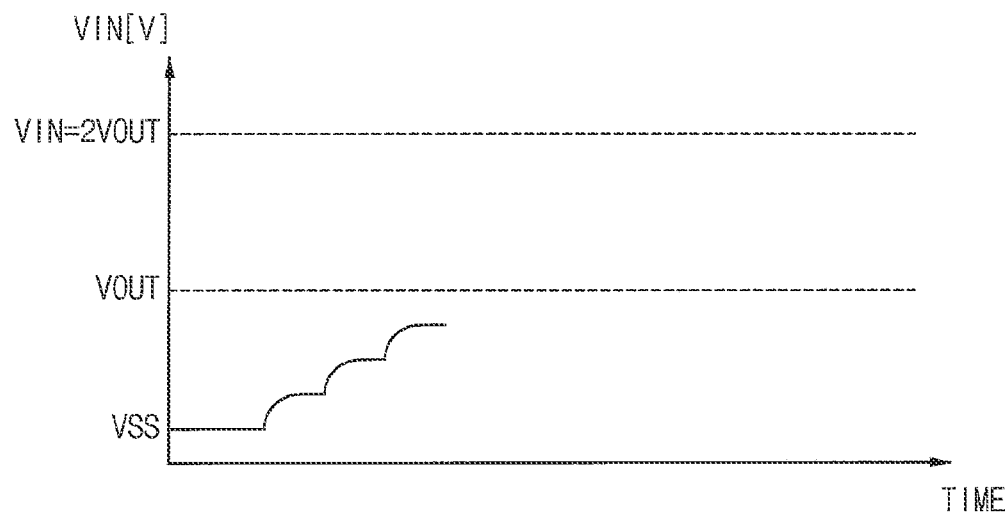

FIG. 24 illustrates the output voltage and the input voltage during the first interval of the boosting operation of the bi-directional voltage converter.

Figure 25:
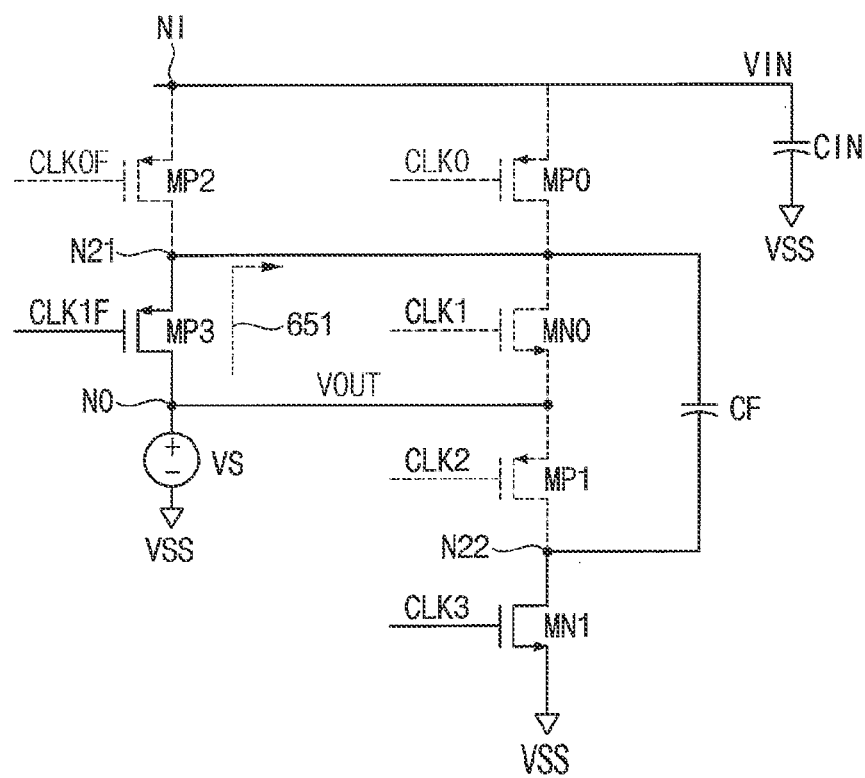
Figure 26:
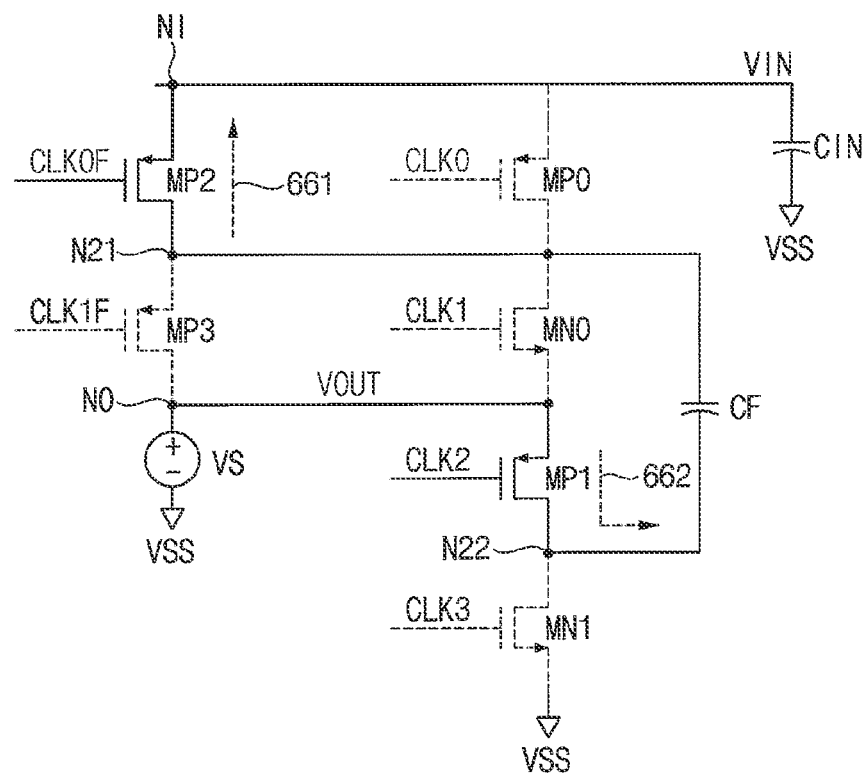

FIGS. 25 and 26 illustrate operations of the switching circuit and the start-up circuit in the bi-directional voltage converter of FIG. 14, in a first phase and a second phase during the second interval of the boosting operation, respectively.

Figure 27:
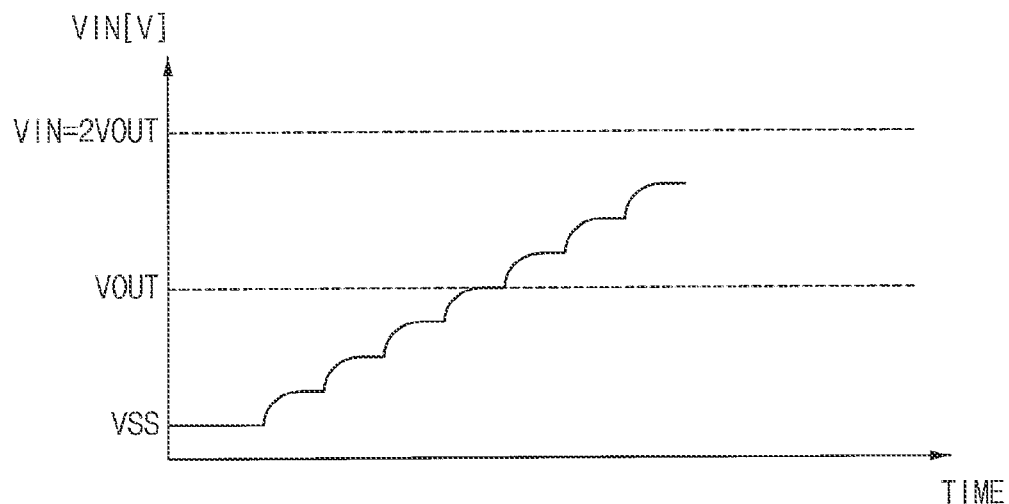

FIG. 27 illustrates the output voltage and the input voltage during the second interval of the boosting operation of the bi-directional voltage converter.

Figure 28:
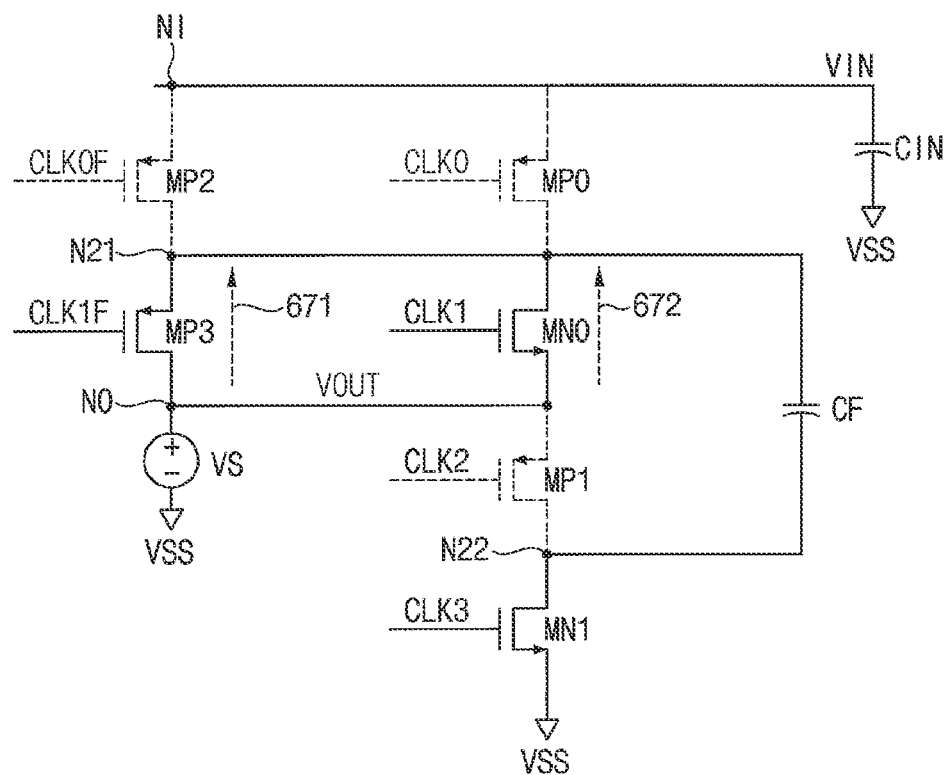
Figure 29:
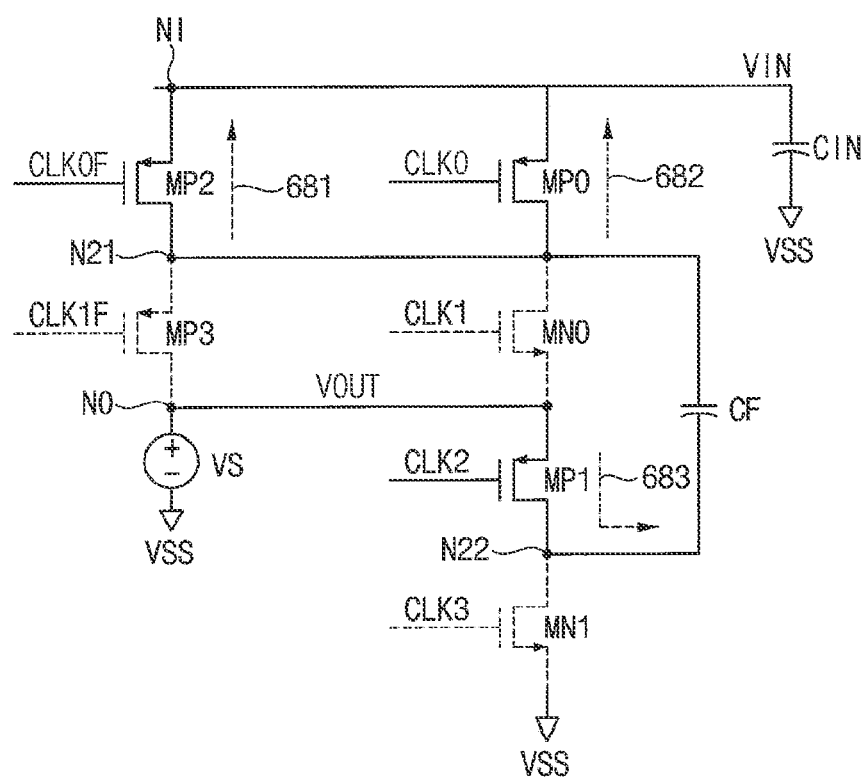

FIGS. 28 and 29 illustrate operations of the switching circuit and the start-up circuit in the bi-directional voltage converter of FIG. 14, in a first phase and a second phase during the third interval of the boosting operation, respectively.

Figure 30:
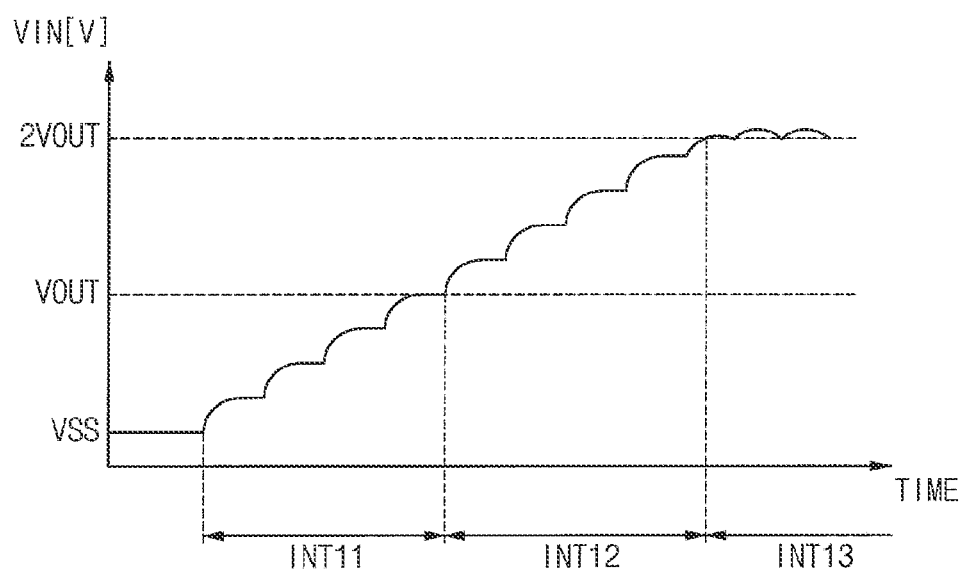

FIG. 30 illustrates the output voltage and the input voltage during the third interval of the boosting operation of the bi-directional voltage converter.

Figure 31:
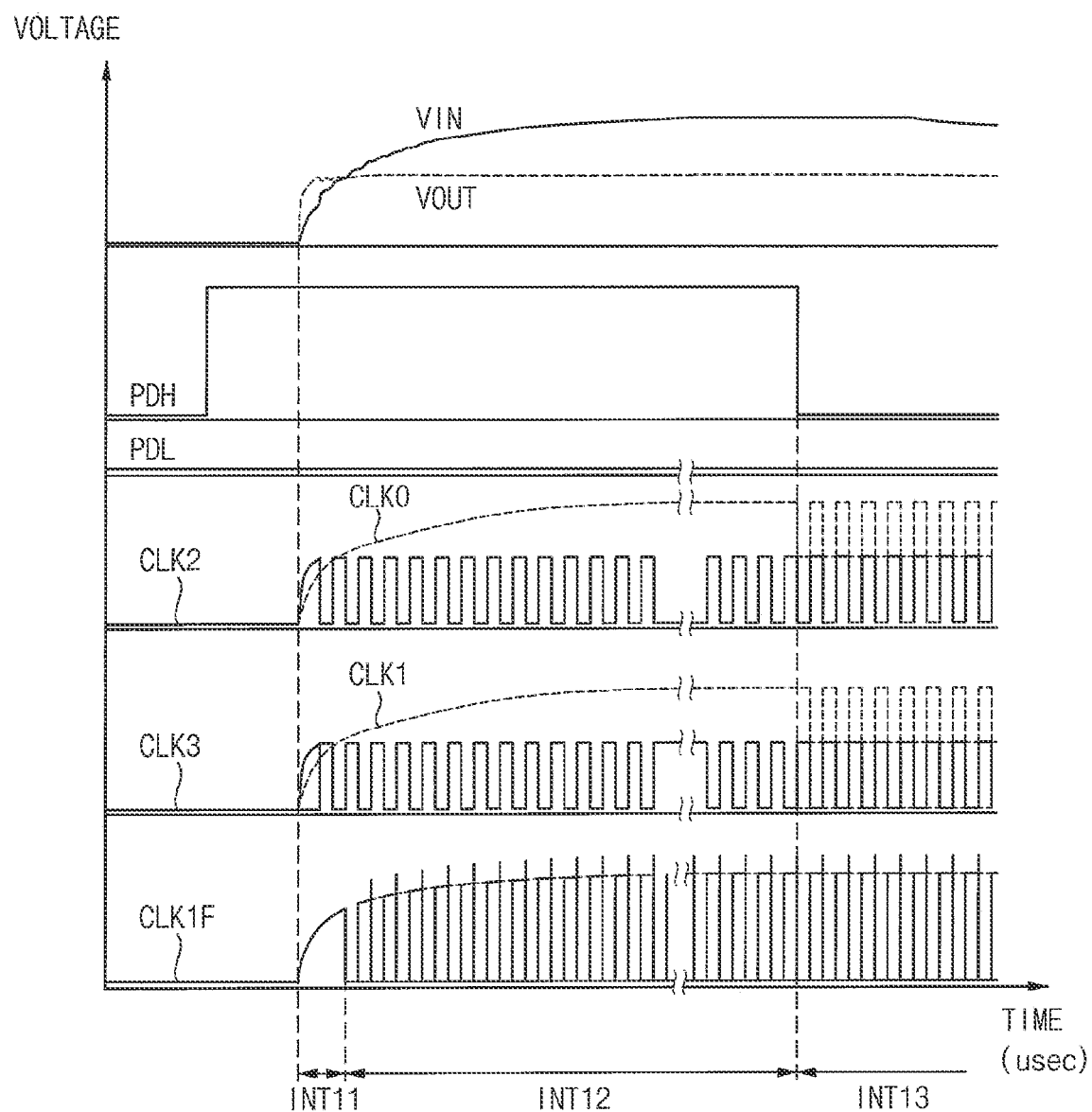

FIG. 31 is a timing diagram illustrating various signals of the bi-directional voltage converter of FIG. 14 in the boosting operation.

Figures 32, 33:
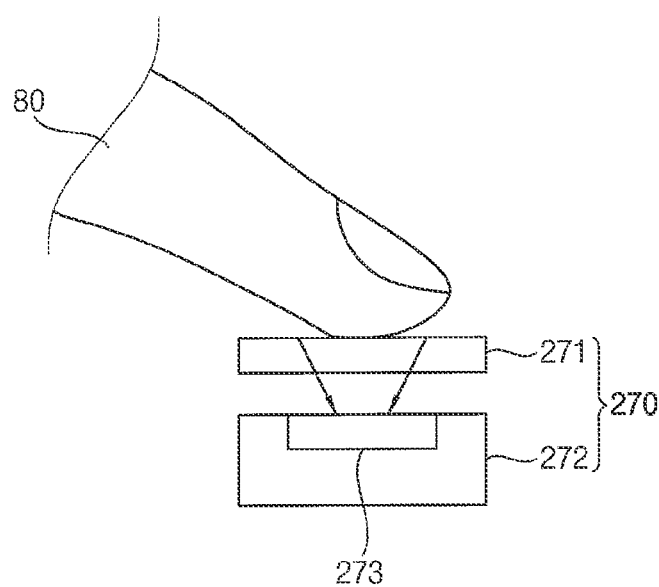

FIG. 32 is a table illustrating logic levels of the first sub power-down signal and the second sub power-down signal based on the input voltage and the output voltage in the bi-directional voltage converter of FIG. 14.

Figure 2:
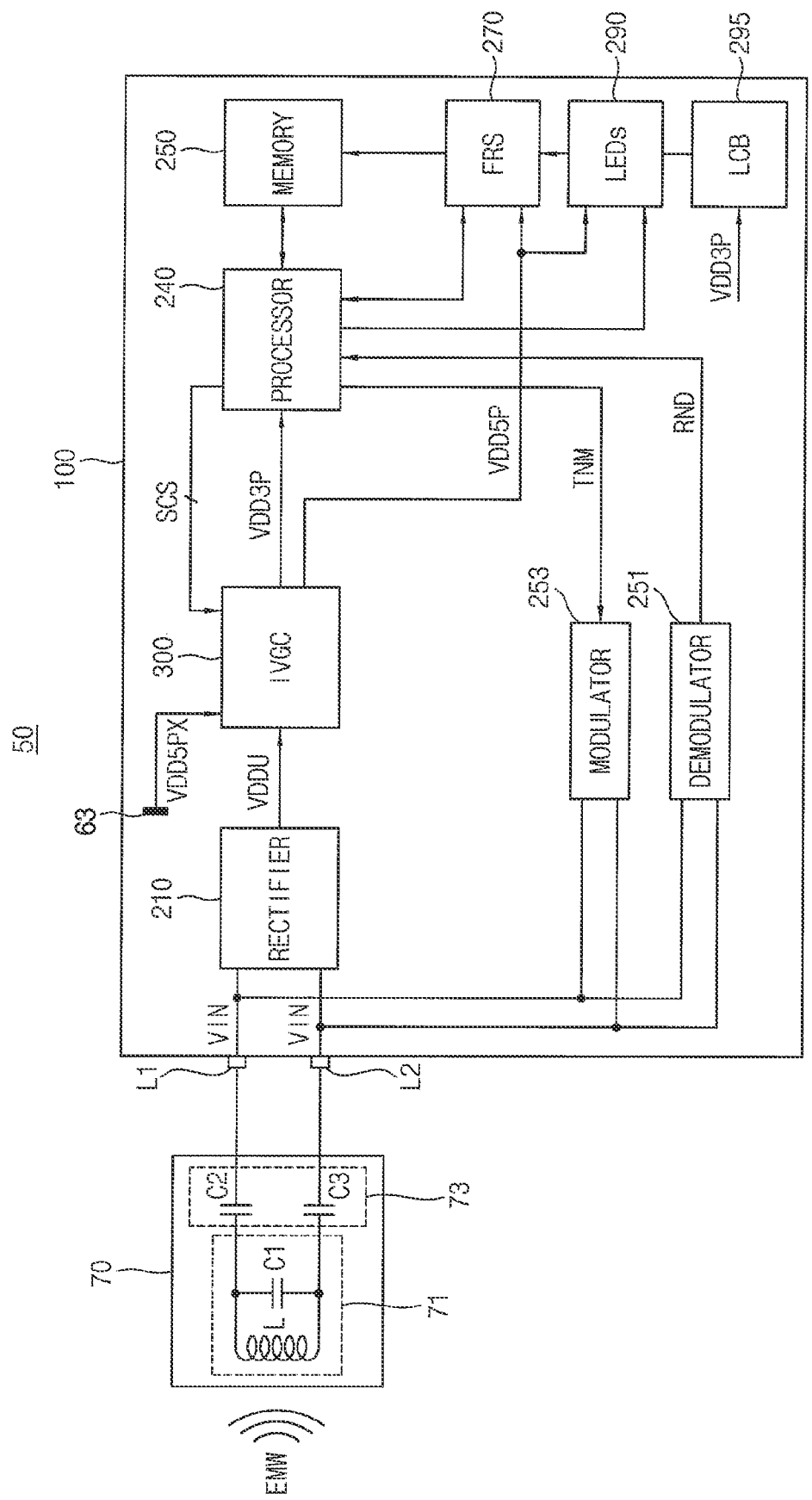
FIG. 2 is a block diagram illustrating an example of the smart card in the smart card system of FIG. 1 according to example embodiments.

FIG. 33 illustrates an example of the fingerprint recognition sensor in the smart card chip in FIG. 2 according to example embodiments.

Figure 34:
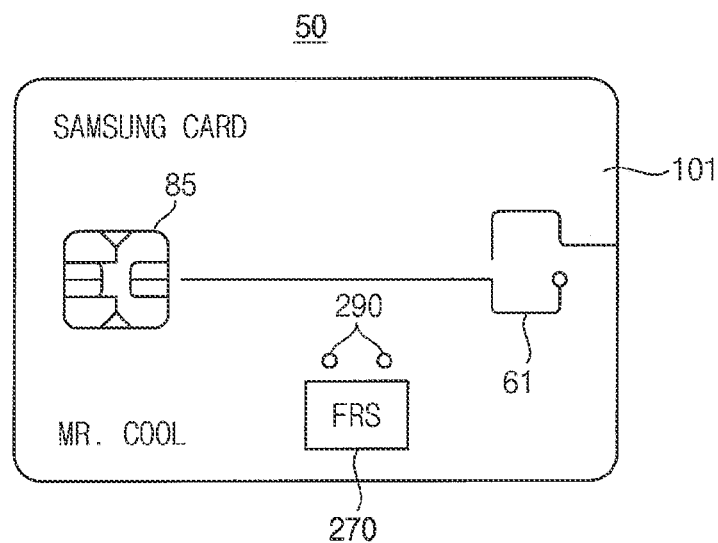

FIG. 34 illustrates an example of the smart card according to example embodiments.

Figure 35:
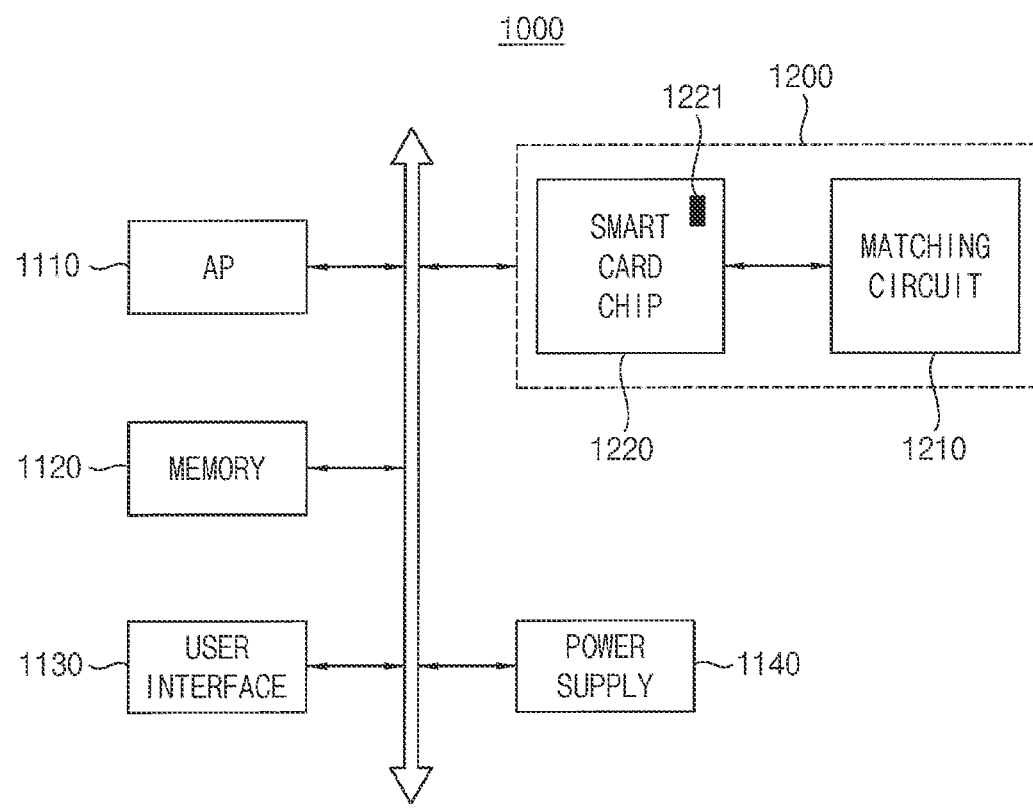

FIG. 35 is a block diagram illustrating an electronic device according to example embodiments.

DETAILED DESCRIPTION OF THE EMBODIMENTS

Example embodiments of the present disclosure will be described more fully hereinafter with reference to the accompanying drawings. Like reference numerals may refer to like elements throughout the accompanying drawings.

Figure 1:
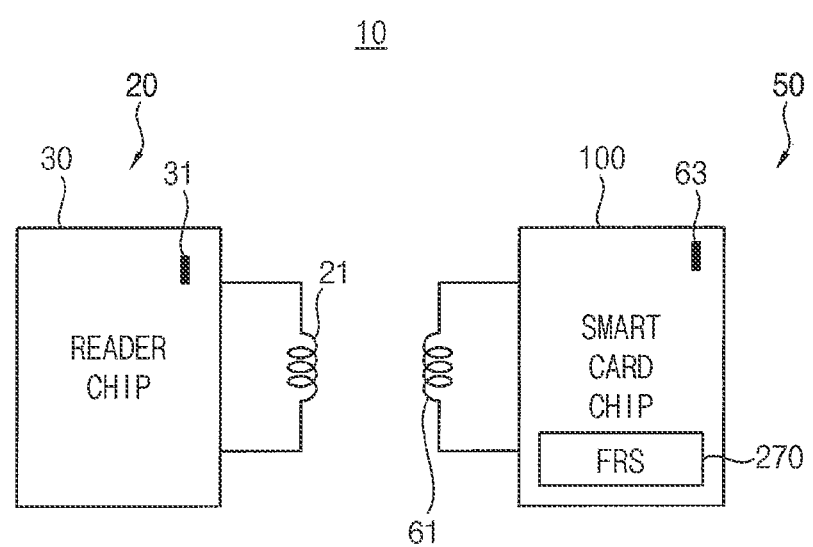
FIG. 1 is a diagram illustrating a smart card system according to some example embodiments.

FIG. 1 is a diagram illustrating a smart card system according to some example embodiments.

Referring to FIG. 1, a smart card system 10 may include a card reader 20 and a smart card 50.

The card reader 20 may include a reader chip 30 and an antenna 21. The reader chip 30 may include a card socket 31 which provides a voltage to the smart card 50 and exchanges data with the smart card 50 when the smart card 50 is in contact with the card socket 31. When the smart card 50 is inserted into the card socket 31, the reader chip 30 provides an operating voltage to the smart card 50, recognizes the smart card 50, and exchanges payment data with the smart card 50.

The smart card 50 may include an antenna 61 and a smart card chip 100. The smart card chip 100 may include a contact terminal 63.

The smart card 50 may communicate with the card reader 20 through the antennal 61 in a contactless manner, may receive the operating voltage from the card reader 20 and may exchange payment data with the card reader 20. When the smart card 50 is inserted into the card socket 31, the smart card 50 may receive the operating voltage through the contact terminal 63 and may exchange payment data with the card reader 20 through the contact terminal 63.

When the smart card 50 communicates with the card reader 20 in a contactless manner, the smart card 50 may receive the operating voltage and may exchange payment data with the card reader 20 in electromagnetic form through the antennas 21 and 61.

The smart card 50 may include a fingerprint recognition sensor (FRS) 270 and may perform user authentication on the payment data through the fingerprint recognition sensor 270 when the payment is executed in a contactless manner.

FIG. 2 is a block diagram illustrating an example of the smart card in the smart card system of FIG. 1 according to example embodiments.

Referring to FIG. 2, the smart card 50 may include a matching circuit 70 and the smart card chip 100. The smart card chip 100 may be connected to the matching circuit 70 through a first power terminal L1 and a second power terminal L2.

The matching circuit 70 may include a resonance circuit 71 and a filter 73 The resonance circuit 71 may include an antenna L and a first capacitor C1. The filter 73 includes and a second capacitor C2 and a third capacitor C3 to provide an induction voltage induced in response to an electromagnetic wave EMW to the first power terminal L1 and the second power terminal L2. When the smart card 50 is coupled to the card reader 20 in a contactless manner, the matching circuit 70 may supply the induction voltage induced in response to the electromagnetic wave EMW to the smart chip 100 as an input voltage VIN.

The smart card chip 100 may receive the input voltage VIN from the matching circuit 70 through the first power terminal L1 and the second power terminal L2 in a contactless mode and the smart card chip 100 may receive a voltage provided through the contact terminal 63 in the contact mode.

The smart card chip 100 may include a rectifier 210, an internal voltage generation circuit (IVGC) 300, a processor 240, a memory 250, a demodulator 251, a modulator 253, a fingerprint recognition sensor 270, LEDs 290 and a logic circuit block (LCB) 295.

The rectifier 210 may generate a contactless voltage VDDU, which is direct current (DC) voltage, by rectifying the input voltage VIN.

The internal voltage generation circuit 300 may receive the contactless voltage VDDU in the contactless mode and may receive a contact voltage VDD5PX in the contact mode. The internal voltage generation circuit 300 may generate a first driving voltage VDD5P and a second driving voltage VDD3P whose level is smaller than a level of the first driving voltage VDD5P based on the contactless voltage VDDU in the contactless mode, and may generate the first driving voltage VDD5P and the second driving voltage VDD3P based on a class of the card reader 20 according to a level of the contact voltage VDD5PX in the contact mode.

The internal voltage generation circuit 300 may provide the second driving voltage VDD3P to the processor 240 and the logic circuit block 295 and may provide the first driving voltage VDD5P to the fingerprint recognition sensor 270 and the LEDs 290. Since the internal voltage generation circuit 300 provides the second driving voltage VDD3P to the processor 240 and the logic circuit block 295 which consume more power, a power consumption of the smart card chip 100 may be reduced.

The processor 240 may control the overall operation of the smart card chip 100.

When the signal reception operation is performed, the demodulator 251 generates reception data RND by demodulating the signal supplied from the matching circuit 70 through the first and second power terminals L1 and L2 to provide the reception data RND to the processor 240. The processor 240 may decode the reception data RND and may store at least a portion of the reception data RND in the memory 250.

When the signal transmission operation is performed, the processor 240 reads out the output data from the memory 250 and encodes the output data to provide a transmission data TNM to the modulator 253 and the modulator 253 may modulate the transmission data TNM to provide a modulation signal to the first and second power terminals L1 and L2. For instance, the modulator 253 may generate the modulation signal by performing load modulation with respect to the transmission data TNM.

The processor 240 may provide switch control signals SCS to the internal voltage generation circuit 300.

The memory 250 may store a user's original fingerprint registered through a pre-processing. The fingerprint recognition sensor 270 may generate a fingerprint image signal based on user's input fingerprint in a payment operation during the contactless mode, and may provide the fingerprint image signal to the processor 240. The processor 240 may compare the fingerprint image signal with the user's original fingerprint and may determine whether the user's input fingerprint is faked based on a result of the comparison. When the processor 240 determines that the user's input fingerprint matches the user's original fingerprint, the processor 240 may indicate that the user authentication is passed by controlling the LEDs 295 to emit light while performing the user authentication on the payment data associated with the payment operation. When the processor 240 determines that the user's input fingerprint does not match the user's original fingerprint, the processor 240 may indicate that the input fingerprint does not match the user's original fingerprint through the LEDs 295.

Figure 3:
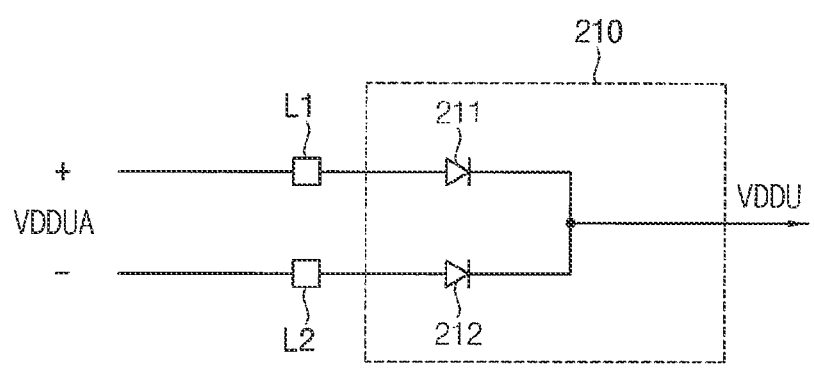
FIG. 3 illustrates an example of the rectifier in the smart card chip in FIG. 2 according to example embodiments.

FIG. 3 illustrates an example of the rectifier in the smart card chip in FIG. 2 according to example embodiments.

Referring to FIG. 3, the rectifier 210 may include a first diode 211 and a second diode 212.

The first diode 211 is connected to the first power terminal L1 and the second diode 212 is connected to the second power terminal L2. The first and second diodes 211 and 212 may rectify an input voltage VDDUA provided through the contact terminal 63 in FIG. 2 to provide the contactless voltage VDDU to the internal voltage generation circuit 300 in the contactless mode.

FIG. 4 is a block diagram illustrating an example of the internal voltage generation circuit in the smart card chip in FIG. 2 according to example embodiments.

Referring to FIG. 4, the internal voltage generation circuit 300 may include a first switched capacitor (SC) converter 310, a second switched capacitor (SC) converter 400, a mode selector 330, a control signal generator 350, a first contact switch 360 and a second contact switch 370. The first switched capacitor converter 310 may be referred to as a switched capacitor converter and the second switched capacitor converter 400 may be referred to as a bidirectional switched capacitor converter.

The first contact switch 360 may be connected to a first node ND1 and may selectively switch the contact voltage VDD5PX received from the (external) card reader 20 to the first node ND1 based on a first switching enable signal SW_EN1, in the contact mode.

The second contact switch 370 may be connected to a second node ND2 and may selectively switch the contact voltage VDD5PX received from the card reader 20 to the second node ND2 based on a second switching enable signal SW_EN2, in the contact mode.

The switched capacitor converter 310 may be connected to the first node ND1 and may lower (step-down) the contactless voltage VDDU received from the card reader 20 to provide a first (reduced) voltage to the first node ND1 in the contactless mode.

The bidirectional switched capacitor converter 400 may be connected to the first node ND1 and the second node ND2, may lower the first driving voltage VDD5P of the first node ND1 to provide a second (reduced) voltage to the second node ND2 in the contactless mode and may either lower the first driving voltage VDD5PX or boost the second driving voltage VDD5P of the second node ND2 based on a level of the contact voltage to provide a boosted voltage to the first node ND1.

The mode selector 330 may receive the contact voltage VDD5PX, the contactless voltage VDDU and the first driving voltage VDD5P, may output a first mode signal MDS1 designating one of the contact mode and the contactless mode and a second mode signal MDS2 designating one of sub-modes of the contact mode based on the levels of the contact voltage VDD5PX, the contactless voltage VDDU and the first driving voltage VDD5P, and may select one of contact voltage VDD5PX, the contactless voltage VDDU and the first driving voltage VDD5P to output the selected one as a control voltage VDMAX. The selected one has the greatest voltage level from among the contact voltage VDD5PX, the contactless voltage VDDU and the first driving voltage VDD5P.

The mode selector 330 may provide the first mode signal MDS1 and the second mode signal MDS2 to the control signal generator 350. The second mode signal MDS2 may include a plurality of bits and may designate the sub-modes of the contact mode.

The control signal generator 350 may generate a first power-down signal PD1, a second power-down signal PD2, the first switching enable signal SW_EN1 and the second switching enable signal SW_EN2 based on the first mode signal MDS1 and the second mode signal MDS2. The second power-down signal PD2 may include a first sub power-down signal and a second sub power-down signal.

The first power-down signal PD1 may be associated with enabling the switched capacitor converter 305, the second power-down signal PD2 may be associated with enabling the bidirectional switched capacitor converter 400, the first switching enable signal SW_EN1 may be associated with enabling the first contact switch 360 and the second switching enable signal SW_EN2 may be associated with enabling the second contact switch 370.

Figure 5:
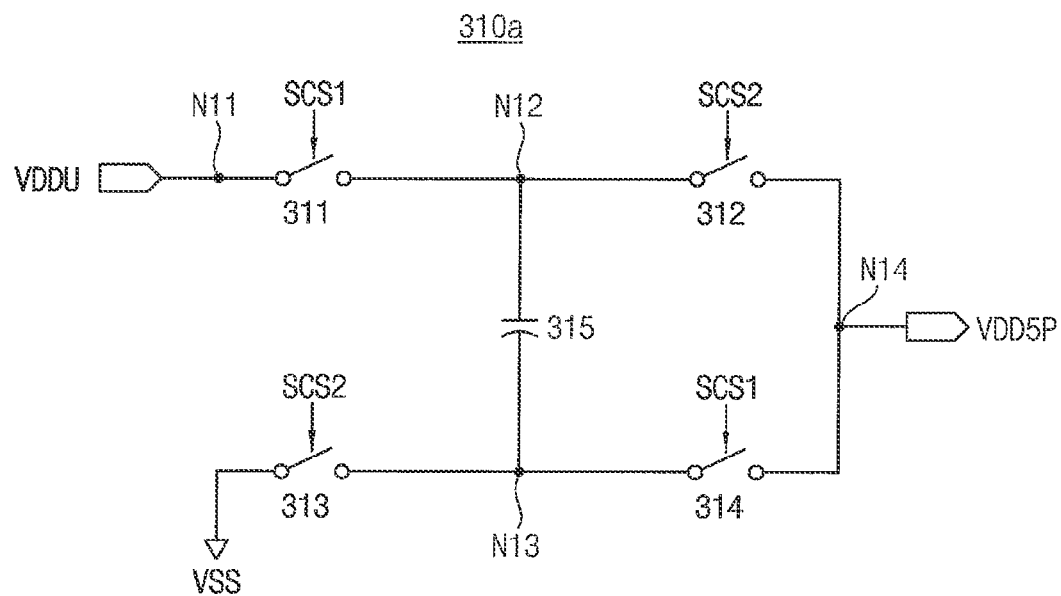
FIG. 5 is a circuit diagram illustrating an example of the switched capacitor converter in the internal voltage generation circuit of FIG. 4 according to example embodiments.

FIG. 5 is a circuit diagram illustrating an example of the switched capacitor converter in the internal voltage generation circuit of FIG. 4 according to example embodiments.

Referring to FIG. 5 a switched capacitor converter 310a may include first, second, third and fourth switches 311, 312, 313 and 314 and a capacitor 315.

The first switch 311 is connected between a first node N11 receiving the contactless voltage VDDU and a second node N12, and is switched in response to a first switch control signal SCS1. The capacitor 315 is coupled between the second node N12 and a third node N13. The second switch 312 is connected between the second node N12 and a fourth node N14 providing the first driving voltage VDD5P, and is switched in response to a second switch control signal SCS2.

The third switch 313 is connected between the third node N13 and a ground voltage VSS, and is switched in response to the second switch control signal SCS2. The fourth switch 314 is connected between the third node N13 and the fourth node N14, and is switched in response to the first switch control signal SCS1.

The first switch control signal SCS1 and the second switch control signal SCS2 may have a same logic level. The first switch 311 and the fourth switch 314 may be turned-on in response to the first switch control signal SCS1 having a low level and may be turned-off in response to the first switch control signal SCS1 having a high level. The second switch 312 and the third switch 313 may be turned-off in response to the second switch control signal SCS2 having a low level and may be turned-on in response to the second switch control signal SCS2 having a high level.

Figure 6:
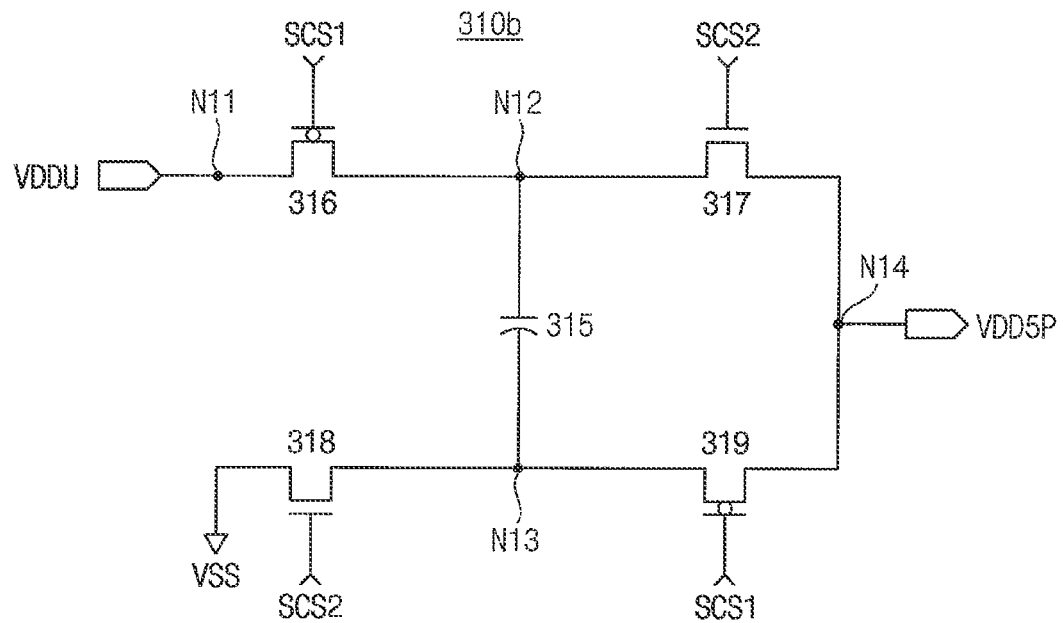
FIG. 6 is a circuit diagram illustrating another example of the switched capacitor converter in the internal voltage generation circuit of FIG. 4 according to example embodiments.

FIG. 6 is a circuit diagram illustrating another example of the switched capacitor converter in the internal voltage generation circuit of FIG. 4 according to example embodiments.

Referring to FIG. 6, a switched capacitor converter 310b may include p-channel metal-oxide semiconductor (PMOS) transistors 316 and 319, n-channel metal-oxide semiconductor (NMOS) transistors 317 and 318 and a capacitor 315.

The PMOS transistor 316 is connected between the first node N11 receiving the contactless voltage VDDU and the second node N12, and is turned-on/off in response to the first switch control signal SCS1. The NMOS transistor 317 is connected between the second node N12 and the fourth node N14 providing the first driving voltage VDD5P, and is turned-on/off in response to the second switch control signal SCS2. The capacitor 315 is coupled between the second node N12 and the third node N13.

The NMOS transistor 318 is connected between the third node N13 and the ground voltage VSS, and is turned-on/off in response to the second switch control signal SCS2. The PMOS transistor 319 is connected between the third node N13 and the fourth node N14, and is turned-on/off in response to the first switch control signal SCS1.

Figure 7:
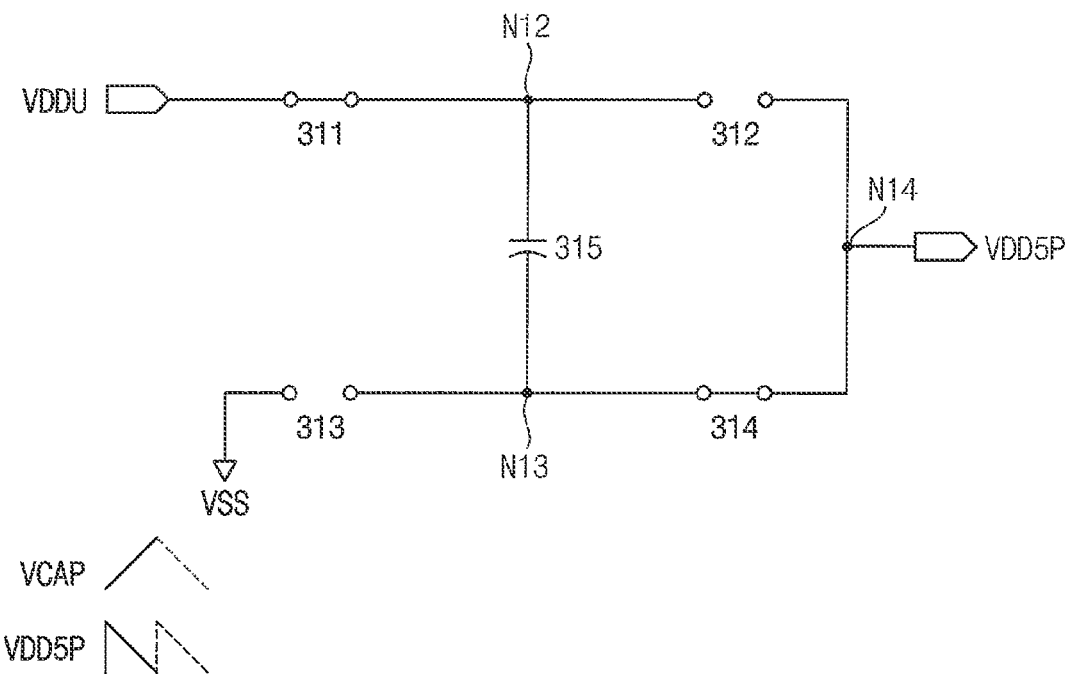
FIG. 7 illustrates an example operation of the switched capacitor converter in FIG. 5.

FIG. 7 illustrates an example operation of the switched capacitor converter in FIG. 5.

An operation of the switched capacitor converter 310b in FIG. 6 may be the same as operation of the switched capacitor converter 310a in FIG. 5.

Referring to FIG. 7, when the first switch 311 and the fourth switch 314 are turned-on and the second switch 312 and the third switch 313 are turned-off during a first phase, a voltage VCAP is stored in the capacitor 315 based on the contactless voltage VDDU and the first driving voltage VDD5P is provided at the fourth node N14 based on the voltage VCAP stored in the capacitor 315.

Figure 8:
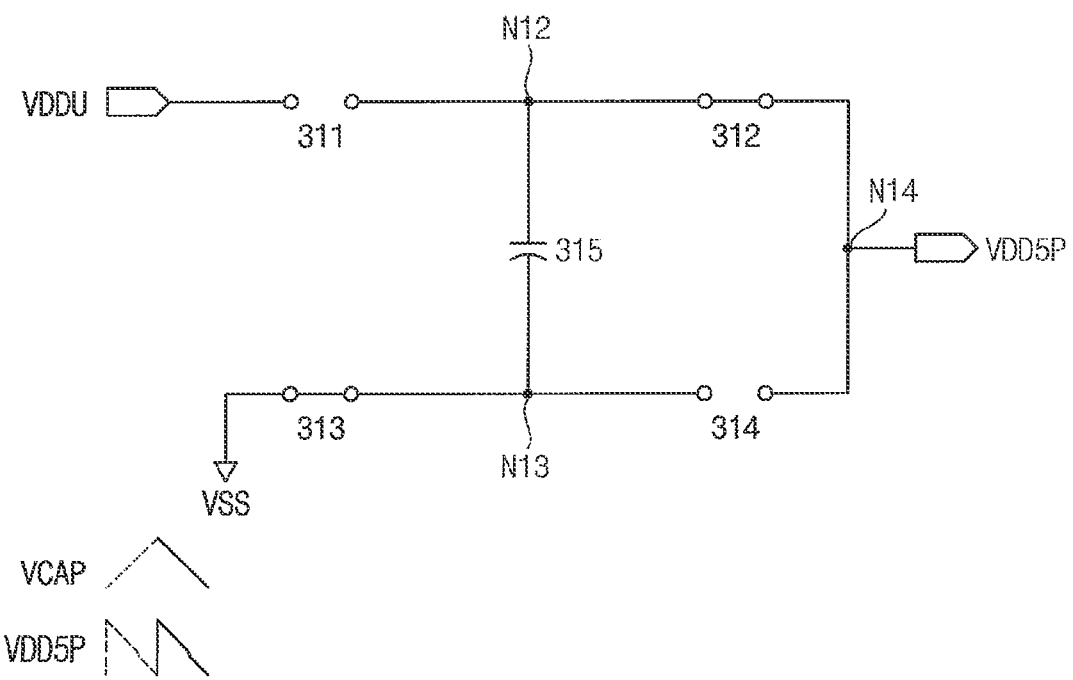
FIG. 8 illustrates an example operation of the switched capacitor converter in FIG. 5.

FIG. 8 illustrates an example operation of the switched capacitor converter in FIG. 5.

An operation of the switched capacitor converter 310b in FIG. 6 may be the same as operation of the switched capacitor converter 310a in FIG. 5.

Referring to FIG. 8, when the first switch 311 and the fourth switch 314 are turned-off and the second switch 312 and the third switch 313 are turned-on during a second phase, a voltage VCAP stored in the capacitor 315 during the first phase linearly decreases and the first driving voltage VDD5P is provided at the fourth node N14 based on the voltage VCAP stored in the capacitor 315.

Figure 9:
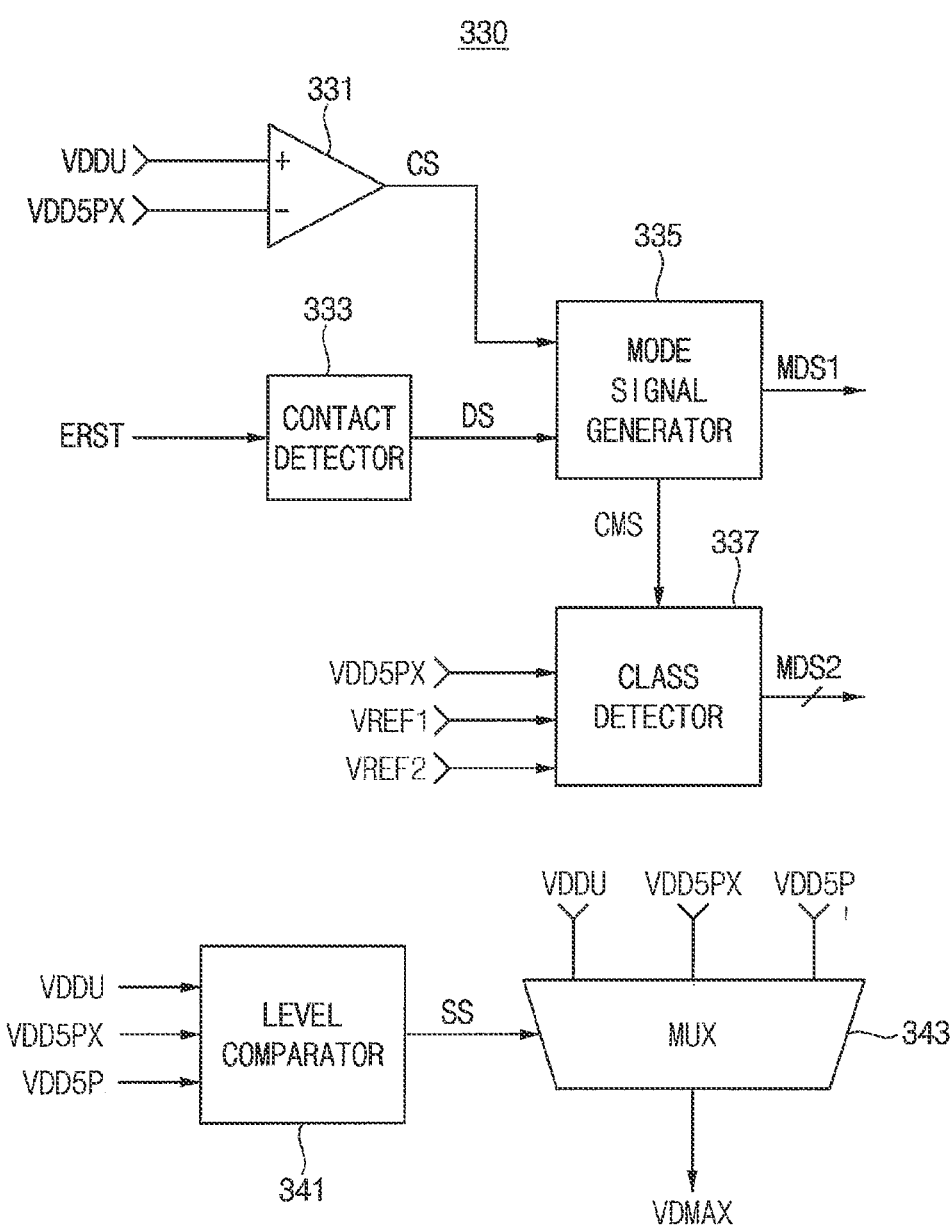
FIG. 9 is a block diagram illustrating an example of the mode selector in the internal voltage generation circuit of FIG. 4 according to example embodiments.

FIG. 9 is a block diagram illustrating an example of the mode selector in the internal voltage generation circuit of FIG. 4 according to example embodiments.

Referring to FIG. 9, the mode selector 330 may include a comparator 331, a contact detector 333, a mode signal generator 335, a class detector 337, a level comparator 341 and a multiplexer 343.

The comparator 331 may compare the contactless voltage VDDU and the contact voltage VDD5PX to output a comparison signal CS indicating a result of the comparison. The contact detector 333 may output a detection signal DS associated with detecting an external reset signal ERST based on the external reset signal ERST received from the card reader 20 in the contact mode when the smart card 50 is connected to the card reader 20 in a contact manner.

The mode signal generator 335 may generate the first mode signal MDS1 designating one of the contact mode and the contactless mode and may generate a contact mode signal CMS designating the contact mode based on the comparison signal CS and the detection signal DS. Since the comparison signal CS indicates a result of the comparison of the contactless voltage VDDU and the contact voltage VDD5PX and the detection signal DS indicates whether the external reset signal ERST is applied, the mode signal generator 335 may determine logic levels of the first mode signal MDS1 and the contact mode signal CMS.

The class detector 337 may be enabled in response to the contact mode signal CMS designating the contact mode, may compare the contact voltage VDD5PX with a first reference voltage VREF1 and a second reference voltage VREF2 to generate the second mode signal MDS2 indicating a class of the card reader 20, associated with the sub-modes.

The class detector 337 may determine a logic level of the second mode signal MDS2 based on comparing the contact voltage VDD5PX with first reference voltage VREF1 and the second reference voltage VREF2. The second reference voltage VREF2 may be smaller than the first reference voltage VREF1.

In embodiments, the first reference voltage VREF1 may be set to about 4 [V] and the first reference voltage VREF2 may be set to about 2.4 [V].

For example, when the contact voltage VDD5PX is greater than the first reference voltage VREF1, the second mode signal MDS2 may designate a first sub-mode of the contact mode. For example, when the contact voltage VDD5PX is smaller than the first reference voltage VREF1 and greater than the second reference voltage VREF2, the second mode signal MDS2 may designate a second sub-mode of the contact mode. For example, when the contact voltage VDD5PX is smaller than the second reference voltage VREF2, the second mode signal MDS2 may designate a third sub-mode of the contact mode.

The first sub-mode may indicate that the card reader 20 corresponds to a first class and may provide the contact voltage VDD5PX with about 5 [V], the second sub-mode may indicate that the card reader 20 corresponds to a second class and may provide the contact voltage VDD5PX with about 3 [V] and the third sub-mode may indicate that the card reader 20 corresponds to a third class and may provide the contact voltage VDD5PX with about 1.8 [V].

The level comparator 341 may compare the contact voltage VDD5PX, the contactless voltage VDDU and the first driving voltage VDD5P to output a selection signal SS to the multiplexer 343 indicating one having the greatest voltage level from among the contact voltage VDD5PX, the contactless voltage VDDU and the first driving voltage VDD5P.

The multiplexer 343 may output the one having the greatest voltage level from among the contact voltage VDD5PX, the contactless voltage VDDU and the first driving voltage VDD5P as the control voltage VDMAX in response to the selection signal SS.

Figure 10:
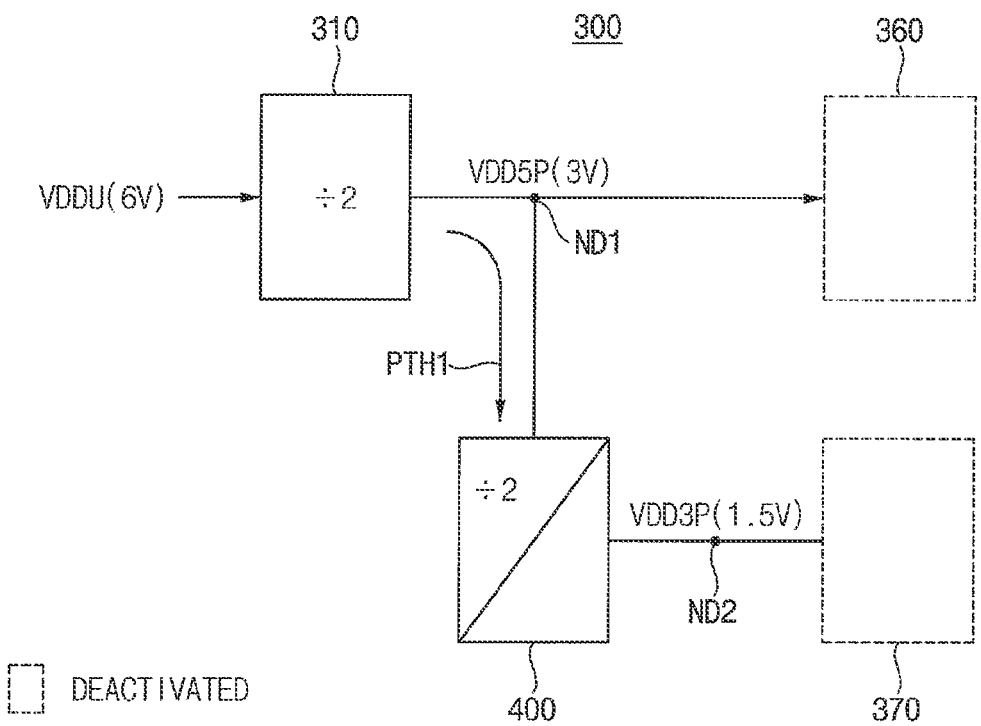
FIG. 10 illustrates a portion of the internal voltage generation circuit of FIG. 4 in the contactless mode.

FIG. 10 illustrates a portion of the internal voltage generation circuit of FIG. 4 in the contactless mode and each of FIGS. 11 through 13 illustrates a portion of the internal voltage generation circuit of FIG. 4 in the contact mode.

In FIGS. 10 through 13, the switched capacitor converter 310, the bidirectional switched capacitor converter 400, the first contact switch 360 and the second contact switch 370 in the internal voltage generation circuit 300 of FIG. 4 are illustrated for convenience of explanation.

Referring to FIGS. 4 and 10, the control signal generator 350 may disable the first contact switch 360 and the second contact switch 370, respectively, by using the first switching enable signal SW_EN1 and the second switching enable signal SW_EN2, in response to the first mode signal MDS1 in the contactless mode.

The switched capacitor converter 310 may be enabled in response to the first power-down signal PD1 and may lower the contactless voltage having VDDU a first voltage level (about 6 [V]) to output the first driving voltage VDD5P having a second voltage level (about 3 [V]) to the first node ND1. The second voltage level is smaller than the first voltage level.

The bidirectional switched capacitor converter 400 may receive the first driving voltage VDD5P through a first path PTH1, may lower the first driving voltage VDD5P to output the second driving voltage VDD5P having a third voltage level (about 1.5 [V]) to the second node ND2. The third voltage level is smaller than the second voltage level.

Referring to FIGS. 4 and 11, in a first sub mode in the contact mode, the control signal generator 350 may disable the switched capacitor converter 310 and the second contact switch 370, respectively, by using the first power-down signal PD1 and the second switching enable signal SW_EN2, in response to the first mode signal and the second mode signal MDS2.

The first contact switch 360 may switch the contact voltage VDD5PX having a first voltage level (about 5 [V]) to the first node ND1 as the first driving voltage VDD5P. The bidirectional switched capacitor converter 400 may be enabled in response to the second power-down signal PD2, may receive the first driving voltage VDD5P through a path PTH2 and may lower the first driving voltage VDD5P having a first level (about 5 [V]) to output the second driving voltage VDD3P having a second voltage level (about 2.5 [V]) to the second node ND2. The second voltage level is smaller than the first voltage level.

The internal voltage generation circuit 300 may generate the first driving voltage VDD5P having a first level (about 5 [V]) and the second driving voltage VDD3P having a second voltage level (about 2.5 [V]) in the first sub-mode of the contact mode.

Referring to FIGS. 4 and 12, in a second sub mode in the contact mode, the control signal generator 350 may disable the switched capacitor converter 310 and the bidirectional switched capacitor converter 400, respectively, by using the first power-down signal PD1 and the second power-down signal PD2, in response to the first mode signal MDS1 and the second mode signal MDS2.

The first contact switch 360 may switch the contact voltage VDD5PX having a first voltage level (about 3 [V]) to the first node ND1 as the first driving voltage VDD5P. The second contact switch 370 may switch the contact voltage VDD5PX having a first voltage level (about 3 [V]) to the second node ND2 as the second driving voltage VDD3P.

The internal voltage generation circuit 300 may generate the first driving voltage VDD5P having about 3 [V] and the second driving voltage VDD3P having about 3 [V] in the second sub-mode of the contact mode.

Referring to FIGS. 4 and 13, in a third sub mode in the contact mode, the control signal generator 350 may disable the switched capacitor converter 310 and the first contact switch 360, respectively, by using the first power-down signal PD1 and the first switching enable signal SW_EN1, in response to the first mode signal MDS1 and the second mode signal MDS2.

The second contact switch 370 may switch the contact voltage VDD5PX having a first voltage level (about 1.8 [V]) to the second node ND2 as the second driving voltage VDD3P.

The bidirectional switched capacitor converter 400 may be enabled in response to the second power-down signal PD2, may boost the second driving voltage VDD3P having a first voltage level (about 1.8 [V]) to output the first driving voltage VDD5P having a second voltage level (about 3.6 [V]) to the first node ND1 through a path PTH3, the second voltage level is greater than the first voltage level.

That is, the internal voltage generation circuit 300 may generate the first driving voltage VDD5P having about 3.6 [V] and the second driving voltage VDD3P having about 1.8 [V] in the third sub-mode of the contact mode.

The internal voltage generation circuit 300 according to example embodiments includes the first contact switch 360, the second contact switch 370 and the bidirectional switched capacitor converter 400 and may generate the second driving voltage VDD3P used for operating the logic circuit block 295 and the first driving voltage VDD5P used for operating the fingerprint recognition sensor 270 and the LEDs 295 even when a level of the contact voltage VDD5PX varies based on a class of the card reader 20.

FIG. 14 is a block diagram illustrating an example of the bi-directional voltage converter in the internal voltage generation circuit of FIG. 4 according to example embodiments.

Referring to FIG. 14, the bi-directional voltage converter 400 may include an oscillator OSC 405, a dead time generator DTG 410, an operating voltage generator 407, a gate driving circuit 420, a switching circuit 450, a start-up circuit 455, a delayed clock generator 460 and a storage capacitor CF.

The bi-directional voltage converter 400 may further include an input capacitor CIN and an output capacitor COUT. The input capacitor CIN may be coupled between an input node NI and a ground voltage VSS and the output capacitor COUT may be coupled between an output node NO and the ground voltage VSS. The input node NI may correspond to the first node ND1 and the output node NO may correspond to the second node ND2.

The oscillator 405 may generate a reference clock signal CLK and may provide the reference clock signal CLK to the dead time generator 410. The reference clock signal CLK may be referred to as a default clock signal.

The dead time generator 410 may generate a first output signal OUT1 and a second output signal OUT2 having non-overlapping activation intervals with each other based on the reference clock signal CLK and may provide the first output signal OUT1 and the second output signal OUT2 to the gate driving circuit 420.

The operating voltage generator 407 may compare levels of an input voltage VIN and an output voltage VOUT and may provide the dead time generator 410 with one of the input voltage VIN and the output voltage VOUT, whose voltage level is greater, as an operating voltage. The dead time generator 410 may operate based on the operating voltage from the operating voltage generator 407 and may generate the first output signal OUT1 and the second output signal OUT2.

The gate driving circuit 420 may generate first through fourth clock signals CLK0, CLK1, CLK2 and CLK3 based on the first output signal OUT1, the second output signal OUT2, a first sub power-down signal PDH and a second sub power-down signal PDL, and at least some of the first through fourth clock signals CLK0, CLK1, CLK2 and CLK3 have non-overlapping activation intervals with one another. The gate driving circuit 420 may provide the first through fourth clock signals CLK0, CLK1, CLK2 and CLK3 to the switching circuit 450.

The gate driving circuit 420 may include a first gate driver HSPD 430, a second gate driver HSND 440, a third gate driver LSPD 430*a* and a fourth gate driver LSND 440*a* connected between the input voltage VIN and the ground voltage VSS.

The first gate driver 430 may be selectively enabled in response to the first sub power-down signal PDH and may delay the first output signal OUT1 to output the first clock signal CLK0. The second gate driver 440 may be selectively enabled in response to the first sub power-down signal PDH and may delay the second output signal OUT2 to output the second clock signal CLK1.

The third gate driver 430*a* may be selectively enabled in response to the second sub power-down signal PDL and may delay the first output signal OUT1 to output the third clock signal CLK2. The fourth gate driver 440*a* may be selectively enabled in response to the second sub power-down signal PDL and may delay the second output signal OUT2 to output the fourth clock signal CLK3.

The switching circuit 450 may include a first p-channel metal-oxide semiconductor (PMOS) transistor MP0, a first n-channel metal-oxide semiconductor (NMOS) transistor MN0, a second PMOS transistor MP1 and a second NMOS transistor MN1 connected in series between the input node NI and the ground voltage VSS. Each of the first PMOS transistor MP0, the first NMOS transistor MN0, the second PMOS transistor MP1 and the second NMOS transistor MN1 may be switched in response to respective one of the first through fourth clock signals CLK0, CLK1, CLK2 and CLK3. The first PMOS transistor MP0, the first NMOS transistor MN0, the second PMOS transistor MP1 and the second NMOS transistor MN1 may be referred to a first switching element, a second switching element, a third switching element and a fourth switching element, respectively. The switching circuit 450 may store the output voltage VOUT applied to the output node NO in the storage capacitor CF coupled between a first node N21 and a second N22 therein, in a boosting operation.

The first PMOS transistor MP0 has a source coupled to the input node NI, a gate receiving the first clock signal CLK0 and a drain coupled to the first node N21. The first NMOS transistor MN0 has a drain coupled to the first node N21, a gate receiving the second clock signal CLK1 and a source coupled to the output node NO. The second PMOS transistor MP1 has a source coupled to the output node NO, a gate receiving the third clock signal CLK2 and a drain coupled to the second node N22. The second NMOS transistor MN1 has a drain coupled to the second node N22, a gate receiving the fourth clock signal CLK3 and a source coupled to the ground voltage VSS.

In an embodiment, each of the first PMOS transistor MP0 and the second PMOS transistor MP1 has an M ratio of channel width over a channel length and M is an integer greater than one. Each of the first NMOS transistor MN0 and the second NMOS transistor MN1 has an N ratio of channel width over a channel length and N is an integer greater than one.

The start-up circuit 455 may include a third PMOS transistor MP2 and a fourth PMOS transistor MP3 connected in series between the input node NI and the output node NO, third PMOS transistor MP2 and the fourth PMOS transistor MP3 may be switched in response to a first delayed clock signal CLK0F and a second delayed clock signal CLK1K having non-overlapping activation intervals with each other and may provide the output voltage VOUT stored in the storage capacitor CF to the input node NI in the boosting operation. The third PMOS transistor MP2 may be referred to as a first start-up transistor and the fourth PMOS transistor MP3 may be referred to as a second start-up transistor.

The third PMOS transistor MP2 has a source coupled to the input node NI, a gate receiving the first delayed clock signal CLK0F and a drain coupled to the first node N21, in parallel with the first PMOS transistor MP0. The fourth PMOS transistor MP3 has a source coupled to the first node N21, a gate receiving the second delayed clock signal CLK1F and a drain coupled to the output node NO.

In an embodiment, the third PMOS transistor MP2 has an M/K ratio of channel width over a channel length and K is an integer greater than nine. The fourth PMOS transistor MP3 has an N/K ratio of channel width over a channel length. A channel width over a channel length of the third PMOS transistor MP2 is K times smaller than a channel width over a channel length of the first PMOS transistor MP0, and a channel width over a channel length of the fourth PMOS transistor MP3 is K times smaller than a channel width over a channel length of the first NMOS transistor MN0. Therefore, each switching timing of the third PMOS transistor MP2 and the fourth PMOS transistor MP3 is faster than each switching timing of the first PMOS transistor MP0, the first NMOS transistor NM0, the second PMOS transistor MP1 and the second NMOS transistor MN1.

The delayed clock generation circuit 460 may be connected between the input voltage VIN and the ground voltage VSS and may include a first delayed clock generator (FDG1) 470 and a second delayed clock generator (FDG2) 480.

The first delayed clock generator is configured to be selectively enabled in response to the second power-down signal and configured to delay the first output signal to generate the first delayed clock signal. The first delayed clock generator 470 includes a plurality of first delay cells which are cascade-connected. Each of the first delay cells is connected between the input voltage VIN and the ground voltage VSS.

The first delayed clock generator 470 may be selectively enabled in response to the second power-down signal PDL and may delay the first output signal OUT1 to generate the first delayed clock signal CLK0F. The second delayed clock generator 480 may be selectively enabled in response to the second power-down signal PDL and may delay the second output signal OUT2 to generate the second delayed clock signal CLK1F.

In an embodiment, the first delayed clock signal CLK0F may have a first falling delay with respect to the second clock signal CLK1 and the second delayed clock signal CLK1F may have a second falling delay with respect to the first clock signal CLK0.

FIG. 15 is a circuit diagram illustrating an example of the dead time generator in the bi-directional voltage converter of FIG. 14 according to example embodiments.

Referring top FIG. 15, the dead time generator 410 may include an inverter 411, NAND gates 412 and 413 and an inverter 414.

The inverter 411 inverts the reference clock signal CLK, and the NAND gate 412 performs a NAND operation on an output of the inverter 411 and an output of the NAND gate 413 to provide the first output signal OUT1.

The NAND gate 413 performs a NAND operation on the reference clock signal CLK and an output of the NAND gate 412. The inverter 414 inverts the output of the NAND gate 413 to provide the second output signal OUT2. The inverter 411, the NAND gates 412 and 413 and the inverter 414 may operate based on a voltage provided from the operating voltage generator 407.

FIG. 16 is a circuit diagram illustrating an example of the gate driving circuit in FIG. 14 according to example embodiments.

Referring to FIG. 16, the first gate driver 430 may include a plurality of first delay cells 431~435 which are cascade-connected, and each of the first delay cells 431~435 may be connected between the input voltage VIN and a half input voltage VIN/2 corresponding to a half of the input voltage VIN. Each of the first delay cells 431~435 may include an inverter and the first delay cells 431~435 may delay the first output signal OUT1 to output the first clock signal CLK0. Therefore, the first clock signal CLK0 may swing between the input voltage VIN and the half input voltage VIN/2.

The second gate driver 440 may include a plurality of second delay cells 441~445 which are cascade-connected, and each of the second delay cells 441~445 may be connected between the input voltage VIN and the half input voltage VIN/2. Each of the second delay cells 441~445 may include an inverter and the second delay cells 441~445 may delay the second output signal OUT2 to output the second clock signal CLK1. Therefore, the second clock signal CLK1 may swing between the input voltage VIN and the half input voltage VIN/2.

The first gate driver 430a may include a plurality of third delay cells 431a~435a which are cascade-connected, and each of the third delay cells 431a~435a may be connected between the half input voltage VIN/2 and the ground voltage VSS. Each of the third delay cells 431a~435a may include an inverter and the third delay cells 431a~435a may delay the first output signal OUT1 to output the third clock signal CLK2. Therefore, the third clock signal CLK2 may swing between the half input voltage VIN/2 and the ground voltage VSS.

The fourth gate driver 440a may include a plurality of fourth delay cells 441a~445a which are cascade-connected, and each of the fourth delay cells 441a~445a may be connected between the half input voltage VIN/2 and the ground voltage VSS. Each of the fourth delay cells 441a~445a may include an inverter and the fourth delay cells 441a~445a may delay the second output signal OUT2 to output the fourth clock signal CLK3. Therefore, the fourth clock signal CLK3 may swing between the half input voltage VIN/2 and the ground voltage VSS.

FIG. 17 is a circuit diagram illustrating an example of the delayed clock generation circuit in FIG. 14 according to example embodiments.

Referring to FIG. 14, the first delayed clock generator 470 may include a plurality of first delay cells 471~475 which are cascade-connected, and each of the first delay cells 471~475 may be connected between the input voltage VIN and the ground voltage VSS. Each of the first delay cells 471~475 may include an inverter and the first delay cells 471~475 may delay the first output signal OUT1 to output the first delayed clock signal CLK0F. Therefore, the first delayed clock signal CLK0F may swing between the input voltage VIN and the ground voltage VSS.

The second delayed clock generator 480 may include a plurality of second delay cells 481~485 which are cascade-connected, and each of the second delay cells 481~485 may be connected between the input voltage VIN and the ground voltage VSS. Each of the second delay cells 481~485 may include an inverter and the second delay cells 481~485 may delay the second output signal OUT2 to output the second delayed clock signal CLK1F. Therefore, the second delayed clock signal CLK1F may swing between the input voltage VIN and the ground voltage VSS.

FIG. 18 is a timing diagram illustrating various signals in the bi-directional voltage converter of FIG. 14.

In FIG. 18, it is assumed that the first output signal OUT1 and the first delayed clock signal CLK0F are activated with a low level corresponding to the ground voltage VSS, the first clock signal CKLK0 is activated with a low level corresponding to the half input voltage VIN/2 and the second output signal OUT2 and the second clock signal CLK1 are activated with a high level corresponding to the input voltage VIN.

Referring to FIG. 18, a low level VSS interval of the first output signal OUT1 and a high level VIN interval of the second output signal OUT2 are non-overlapped. The first output signal OUT1 and the second output signal OUT2 have a non-overlapping activation interval with each other. In addition, a low level VIN/2 interval of the first clock signal CLK0 and a high level VIN interval of the second clock signal CLK1 are non-overlapped. The first clock signal CLK0 and the second clock signal CLK1 have a non-overlapping activation interval with each other.

The first delayed clock signal CLK0F indicated by a reference numeral 513 has a falling delay with respect to a falling edge of the second clock signal CLK1 as indicated by a reference numeral 514. A first delayed clock signal CLK0F', indicated by a reference numeral 511, to be compared with the first delayed clock signal CLK0F does not have a falling delay with respect to a falling edge of the second clock signal CLK1 as indicated by a reference numeral 512. Therefore, the first delayed clock signal CLK0F' and the second clock signal CLK1 may have overlapping activation intervals with each other. In contrast, the first delayed clock signal CLK0F and the second clock signal CLK1 have non-overlapping activation interval with each other.

FIGS. 19 and 20 illustrate operations of the switching circuit and the start-up circuit in the bi-directional voltage converter of FIG. 14, in a first phase and a second phase of a stepping-down operation, respectively.

FIG. 21 illustrates various signals of the bi-directional voltage converter of FIG. 14, in the stepping-down operation.

Referring to FIGS. 19 and 21, in a first phase PH11 of the stepping-down operation in which the input voltage VIN is applied to the input node NI, the fourth PMOS transistor MP3 is turned-off in response to the second delayed clock signal CLK1F, the first NMOS transistor MN0 is turned-off in response to the second clock signal CLK1 and the second NMOS transistor MN1 is turned-off in response to the fourth clock signal CLK3.

The third PMOS transistor MP2 is turned-on in response to the first delayed clock signal CLK0F and connects the input node NI to a first terminal of the storage capacitor CF, the first PMOS transistor MP0 is turned-on in response to the first clock signal CLK0 and connects the input voltage VIN to the first terminal of the storage capacitor CF, and the second PMOS transistor MP1 is turned-on in response to the third clock signal CLK2 and connects a second terminal of the storage capacitor CF to the output node NO. The output node NO is coupled to the output capacitor COUT. Therefore, charges based on the input voltage VIN are stored in the storage capacitor CF through paths 611 and 612.

Referring to FIGS. 20 and 21, in a second phase PH12 of the stepping-down operation, the third PMOS transistor MP2 is turned-off in response to the first delayed clock signal CLK0F, the first PMOS transistor MP0 is turned-off in response to the first clock signal CLK0 and the second PMOS transistor MP1 is turned-off in response to the third clock signal CLK2.

The fourth PMOS transistor MP3 is turned-on in response to the second delayed clock signal CLK1F and connects the first terminal of the storage capacitor CF to the output node NO, the first NMOS transistor MN0 is turned-on in response to the second clock signal CLK1 and connects the first terminal of the storage capacitor CF to the output node NO, and the second NMOS transistor MN1 is turned-on in response to the fourth clock signal CLK3 and connects the ground voltage VSS to the second terminal of the storage capacitor CF. Therefore, the charges stored in the storage capacitor CF are discharged, and the discharged charges are provided to the output node NO as the output voltage VOUT through paths 621 and 622.

The first phase PH11 and the second phase PH12 of the stepping-down operation may be alternatingly repeated. Therefore, a level of the output voltage VOUT at the output node NO increases and the level of the output voltage VOUT may arrive at a level of the input voltage VIN.

Referring to FIG. 31, a boosting operation in which a voltage (the contact voltage VDD5PX) is applied to the output node NO may include a first interval INT11, a second interval INT12 and a third interval INT13 which are determined based on a level of the input voltage VIN boosted by the boosting operation.

During the first interval INT11, a level of the input voltage VIN is smaller than a level of the output voltage VOUT, the first sub power-down signal PDH has a high level and the second sub power-down signal PDL has a low level.

During the second interval INT12, the level of the input voltage VIN is greater than the level of the output voltage VOUT and is smaller than two-times a level 2*VOUT of the output voltage, the first sub power-down signal PDH has a high level and the second sub power-down signal PDL has a low level.

During the third interval INT13, the level of the input voltage VIN arrives at the two-times level 2*VOUT of the output voltage, the first sub power-down signal PDH has a low level and the second sub power-down signal PDL has a low level.

In addition, since the first sub power-down signal PDH has a high level during the first interval INT11 and the second interval INT12, the first gate driver 430 and the second gate driver 440 are disabled. Therefore, the first clock signal CLK0 and the second clock signal CLK1 are in floating state, the first PMOS transistor MP0 and the first NMOS transistor MN0 are turned-off and the first PMOS transistor MP0 and the first NMOS transistor MN0 do not perform switching operation.

FIGS. 22 and 23 illustrate operations of the switching circuit and the start-up circuit in the bi-directional voltage converter of FIG. 14, in a first phase and a second phase during the first interval of the boosting operation, respectively.

FIG. 24 illustrates the output voltage and the input voltage during the first interval of the boosting operation of the bi-directional voltage converter.

Referring to FIG. 22, in a first phase during the first interval of the boosting operation in which a voltage VS is applied to the output node NO, the third PMOS transistor MP2 is turned-off in response to the first delayed clock signal CLK0F and the second PMOS transistor MP1 is turned-off in response to the third clock signal CLK2. The fourth PMOS transistor MP3 is turned-on in response to the second delayed clock signal CLK0F and connects the first terminal of the storage capacitor CF to the output node NO, and the second NMOS transistor MN1 is turned-on in response to the fourth clock signal CLK3 and connects the ground voltage VSS to the second terminal of the storage capacitor CF. Therefore, the charges based on the voltage VS at the output node NO are stored in the storage capacitor CF through a path 631.

Referring to FIG. 23, in a second phase during the first interval, the fourth PMOS transistor MP3 is turned-off in response to the second delayed clock signal CLK1F, and the second NMOS transistor MN1 is turned-off in response to the fourth clock signal CLK3. The third PMOS transistor MP2 is turned-on in response to the first delayed clock signal CLK0F and connects the input node NI to the first terminal of the storage capacitor CF, and the second PMOS transistor MP1 is turned-on in response to the third clock signal CLK2 and connects the output node NO to the second terminal of the storage capacitor CF. Therefore, the charges based on the voltage VS at the output node NO are stored in the storage capacitor CF through a path 642, the stored charges are discharged, the discharged charges are stored in the input capacitor CIN through a path 641 and the input voltage VIN is provided to the input node NI.

The first phase and the second phase in the first interval INT11 may be alternatingly repeated. Therefore, the level of the input voltage VIN increases step-wisely from the ground voltage VSS as illustrated in FIG. 24.

FIGS. 25 and 26 illustrate operations of the switching circuit and the start-up circuit in the bi-directional voltage converter of FIG. 14, in a first phase and a second phase during the second interval of the boosting operation, respectively.

FIG. 27 illustrates the output voltage and the input voltage during the second interval of the boosting operation of the bi-directional voltage converter.

Referring to FIG. 25, in a first phase during the second interval of the boosting operation, the third PMOS transistor MP2 is turned-off in response to the first delayed clock signal CLK0F and the second PMOS transistor MP1 is turned-off in response to the third clock signal CLK2. The fourth PMOS transistor MP3 is turned-on in response to the second delayed clock signal CLK1F and connects the first terminal of the storage capacitor CF to the output node NO, and the second NMOS transistor MN1 is turned-on in response to the fourth clock signal CLK3 and connects the ground voltage VSS to the second terminal of the storage capacitor CF. Therefore, the charges based on the voltage VS at the output node NO are stored in the storage capacitor CF through a path 651.

Referring to FIG. 26, in a second phase during the second interval, the fourth PMOS transistor MP3 is turned-off in response to the second delayed clock signal CLK1F, and the second NMOS transistor MN1 is turned-off in response to the fourth clock signal CLK3. The third PMOS transistor MP2 is turned-on in response to the first delayed clock signal CLK0F and connects the input node NI to the first terminal of the storage capacitor CF, and the second PMOS transistor MP1 is turned-on in response to the third clock signal CLK2 and connects the output node NO to the second terminal of the storage capacitor CF. Therefore, the charges based on the voltage VS at the output node NO are stored in the storage capacitor CF through a path 662, the stored charges are discharged, the discharged charges are stored in the input capacitor CIN through a path 661 and the input voltage VIN is provided to the input node NI.

The first phase and the second phase in the second interval INT12 may be alternatingly repeated. Therefore, the level of the input voltage VIN increases step-wisely from a level of the output voltage VOUT as illustrated in FIG. 27.

FIGS. 28 and 29 illustrate operations of the switching circuit and the start-up circuit in the bi-directional voltage converter of FIG. 14, in a first phase and a second phase during the third interval of the boosting operation, respectively.

FIG. 30 illustrates the output voltage and the input voltage during the third interval of the boosting operation of the bi-directional voltage converter.

Referring to FIG. 28, in a first phase during the third interval of the boosting operation in which a level of the input voltage VIN arrives at the two-times level 2*VOUT, the third PMOS transistor MP2 is turned-off in response to the first delayed clock signal CLK0F and the second PMOS transistor MP1 is turned-off in response to the third clock signal CLK2.

The fourth PMOS transistor MP3 is turned-on in response to the second delayed clock signal CLK1F and connects the first terminal of the storage capacitor CF to the output node NO, and the second NMOS transistor MN1 is turned-on in response to the fourth clock signal CLK3 and connects the ground voltage VSS to the second terminal of the storage capacitor CF. Therefore, the charges based on the voltage VS as the output node NO are stored in the storage capacitor CF through paths 671 and 672.

Referring to FIG. 29, in a second phase during the third interval, the fourth PMOS transistor MP3 is turned-off in response to the second delayed clock signal CLK1F, and the second NMOS transistor MN1 is turned-off in response to the fourth clock signal CLK3. The third PMOS transistor MP2 is turned-on in response to the first delayed clock signal CLK0F and connects the input node NI to the first terminal of the storage capacitor CF, and the second PMOS transistor MP1 is turned-on in response to the third clock signal CLK2 and connects the output node NO to the second terminal of the storage capacitor CF.

Therefore, the charges based on the voltage VS as the output node NO are stored in the storage capacitor CF through a path 683, the stored charges are discharged, the discharged charges are stored in the input capacitor CIN through paths 681 and 682, and the input voltage VIN is provided to the input node NI.

The first phase and the second phase in the third interval INT13 may be alternatingly repeated. Therefore, the level of the input voltage VIN is maintained at two-times level 2*VOUT as illustrated in FIG. 30.

FIG. 31 is a timing diagram illustrating various signals of the bi-directional voltage converter of FIG. 14 in the boosting operation.

Referring to FIG. 31, since the first sub power-down signal PDH has a high level during the first interval INT11 and the second interval INT12 of the boosting operation, the first clock signal CLK0 and the second clock signal CLK1 are in floating state. The first sub power-down signal PDH has a low level during the third interval INT13 of the boosting operation, the first clock signal CLK0 swings between the input voltage VIN and the half input voltage VIN/2, and the second clock signal CLK1 swings between the input voltage VIN and the half input voltage VIN/2.

Each of the third clock signal CLK2 and the fourth clock signal CLK3 swings between the half input voltage VIN/2 and the ground voltage VSS during each of the first interval INT11, the second interval INT12 and the third interval INT13. In addition, the first delayed clock signal CLK0F and the second delayed clock signal CLK1F have non-overlapping activation intervals (low level).

FIG. 32 is a table illustrating logic levels of the first sub power-down signal and the second sub power-down signal based on the input voltage and the output voltage in the bi-directional voltage converter of FIG. 14.

Referring to FIG. 32, an interval in which the level of the input voltage VIN is smaller than a level of the output voltage VOUT corresponds to the first interval INT11 and the first sub power-down signal PDH has a high level and the second sub power-down signal PDL has a low level during the first interval INT11.

An interval in which the level of the input voltage VIN is greater than the level of the output voltage VOUT and is smaller than two-times level 2*VOUT of the output voltage corresponds to the second interval INT12 and the first sub power-down signal PDH has a high level and the second sub power-down signal PDL has a low level during the second interval INT12.

An interval in which the level of the input voltage VIN arrives at the two-times level 2*VOUT of the output voltage corresponds to the third interval INT13 and the first sub power-down signal PDH has a low level and the second sub power-down signal PDL has a low level during the third interval INT13.

FIG. 33 illustrates an example of the fingerprint recognition sensor in the smart card chip in FIG. 2 according to example embodiments.

Referring to FIG. 33, the fingerprint recognition sensor 270 may include a lens 271 and an image sensor 272, and the image sensor 272 may include a pixel array 273.

The lens 271 may concentrate reflected light from a user's finger 80 on the pixel array 273 of the image sensor 272. The image sensor 272 may generate a fingerprint image signal based on the reflected light and may provide the fingerprint image signal to the processor 240 in FIG. 2.

The processor 240 may compare the fingerprint image signal with the user's original fingerprint and may determine whether the user's input fingerprint is faked based on a result of the comparison. When the processor 240 determines that the user's input fingerprint matches the user's original fingerprint, the processor 240 may indicate that the user authentication is passed by controlling the LEDs 295 to emit light while performing the user authentication on the payment data associated with the payment operation.

FIG. 34 illustrates an example of the smart card according to example embodiments.

Referring to FIG. 34, the smart card 50 may include an integrated circuit 85, an antenna 61, the fingerprint recognition sensor 270 and the LEDs 290 formed in a substrate 101.

The antenna 61 may be coupled to the integrated circuit 85. The integrated circuit 85 may include components from among components of the smart card chip 100 in FIG. 2 except the fingerprint recognition sensor 270 and the LEDs 290, and the contact terminal 63 in FIG. 1 may be included in the integrated circuit 85.

The antenna 61 receives a contactless voltage from the card reader 20 in the contactless mode to provide the contactless voltage to the internal voltage generation circuit in the integrated circuit 85. The contact terminal in the integrated circuit 85 receives a contact voltage from the card reader 20 in the contact mode to provide the contact voltage to the internal voltage generation circuit in the integrated circuit 85

The fingerprint recognition sensor 270 may generate a fingerprint image signal based on user's input fingerprint in a payment operation during the contactless mode and may provide the fingerprint image signal to the processor 240. The processor 240 may compare the fingerprint image signal with the user's original fingerprint and may determine whether the user's input fingerprint is faked based on a result of the comparison. When the processor 240 determines that the user's input fingerprint matches the user's original fingerprint, the processor 240 may indicate that the user authentication is passed by controlling the LEDs 295 to emit light while performing the user authentication on the payment data associated with the payment operation. When the processor 240 determines that the user's input fingerprint does not match the user's original fingerprint, the processor 240 may indicate that the input fingerprint does not match the user's original fingerprint through the LEDs 295.

FIG. 35 is a block diagram illustrating an electronic device according to example embodiments.

Referring to FIG. 35, an electronic device 1000 includes an application processor (AP) 1110, a smart card 1200, a memory device 1120, a user interface 1130 and a power supply 1140. In some embodiments, the electronic system 1000 may be a mobile phone, a smart phone, a personal digital assistant (PDA), a portable multimedia player (PMP), a digital camera, a music player, a portable game console, a navigation system, a laptop computer, or the like.

The application processor 1110 may control overall operations of the electronic system 1000. The application processor 1110 may execute applications, such as a web browser, a game application, a video player, etc. In some embodiments, the application processor 1110 may include a single core or multiple cores. For example, the application processor 1110 may be a multi-core processor, such as a dual-core processor, a quad-core processor, a hexa-core processor, etc. The application processor 1110 may include an internal or external cache memory.

The memory device 1120 may store data required for an operation of the electronic system 1000. For example, the memory device 1120 may store a boot image for booting the electronic system 1000, output data to be outputted to an external device and input data received from the external device. For example, the memory device 1120 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM) or a ferroelectric random access memory (FRAM).

The smart card 1200 may include a matching circuit 1210 and a smart card chip 1220, and the smart card chip 1220 includes a connection terminal 1221. The smart card chip 1220 may receive voltage from an external card reader through the matching circuit 1210 in a contactless manner and may exchange data with the external card reader. The smart card chip 1220 may receive voltage from an external card reader through the connection terminal 1221 in a contact manner and may exchange data with the external card reader. The smart card 1200 may employ the smart card 50 of FIG. 2.

Therefore, the smart card 1200 may include an internal voltage generation circuit and the internal voltage generation circuit includes a first contact switch, a second contact switch, a switched capacitor converter and a bidirectional switched capacitor converter which generate the second driving voltage used for operating the logic circuit block and the first driving voltage used for operating the fingerprint recognition sensor even when a level of the contact voltage varies based on a class of the card reader. The bidirectional switched capacitor converter does not include a charge-pump. The bidirectional switched capacitor converter is connected between an input node and an output node, stores the second driving voltage applied to the output node in a storage capacitor therein in a booting operation, and provides the voltage stored in the storage capacitor to the input node. Therefore, bidirectional switched capacitor converter may boost the first driving voltage at the input node step-wisely.

The user interface 1130 may include at least one input device, such as a keypad or a touch screen, and at least one output device, such as a speaker or a display device. The power supply 1140 may supply a power supply voltage to the electronic system 1000.

In some embodiments, the electronic device 1000 may further include an image processor, and/or a storage device, such as a memory card, a solid state drive (SSD), a hard disk drive (HDD) or a CD-ROM.

In some embodiments, the electronic device 1000 and/or components of the electronic device 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A smart card configured to perform a fingerprint authentication, the smart card comprising:
    a matching circuit configured to receive a voltage from an external card reader without contact and to provide the received voltage as a contactless voltage; and
    a smart card chip coupled to the matching circuit through a first power terminal and a second power terminal,
    wherein:
    the smart card chip includes:
        a connection terminal configured to receive a voltage in contact with the external card reader to provide a contact voltage;
        an internal voltage generation circuit configured to generate a first driving voltage and a second driving voltage based on the contactless voltage in a contactless mode, and configured to generate the first driving voltage and the second driving voltage using the contact voltage in a contact mode, wherein generation of the first driving voltage and the second driving voltage is performed using different methods based on a level of the contact voltage;
        a fingerprint recognition sensor operating based on the first driving voltage, the fingerprint recognition sensor configured to generate a fingerprint image signal based on an input fingerprint; and
        a processor operating based on the second driving voltage, the processor configured to perform the fingerprint authentication based on the fingerprint image signal,
    wherein the internal voltage generation circuit includes a bi-directional voltage converter, the bi-directional voltage converter is connected between an input node and an output node, and the bi-directional voltage converter is configured to boost the first driving voltage step-wisely by storing the second driving voltage applied to the output node, in a storage capacitor therein, and by providing the second driving voltage stored in the storage capacitor to the input node, in a boosting operation.

2. The smart card of claim 1, wherein the bi-directional voltage converter includes:
a gate driving circuit configured to generate first through fourth clock signals based on a first output signal, a second output signal, a first sub power-down signal and a second sub power-down signal, the first clock signal and the second clock signal having non-overlapping activation intervals with each other, and at least some of the first through fourth clock signals having non-overlapping activation intervals with one another;
a switching circuit including first through fourth switching elements connected in series between the input node and a ground voltage, the first through fourth switching elements configured to be switched in response to respective ones of the first through fourth clock signals, and configured to store the second driving voltage applied to the output node in the storage capacitor, coupled between a first node and a second node, in the boosting operation; and
a start-up circuit including a first start-up transistor and a second start-up transistor connected in series between the input node and the output node, the first start-up transistor and the second start-up transistor configured to be switched in response to a first delayed clock signal and a second delayed clock signal to provide the second driving voltage stored in the storage capacitor to the input node in the boosting operation, the first delayed clock signal and the second delayed clock signal having non-overlapping activation intervals with each other.

3. The smart card of claim 2, wherein:
the internal voltage generation circuit further includes:
a mode selector configured to output a first mode signal and a second mode signal, the first mode signal designating one of the contact mode and the contactless mode, the second mode signal designating one of sub-modes of the contact mode; and
a control signal generator configured to generate a first power-down signal and a second power-down signal based on the first mode signal and the second mode signal, and
the second power-down signal includes the first sub power-down signal and the second sub power-down signal.

4. The smart card of claim 3, wherein the bi-directional voltage converter further includes:
a dead time generator configured to generate the first output signal and the second output signal having non-overlapping activation intervals based on a reference clock signal; and
a delayed clock signal generator configured to generate the first delayed clock signal and the second delayed clock signal based on the first output signal, the second output signal and the second power-down signal.

5. A smart card configured to perform a fingerprint authentication, the smart card comprising:
a matching circuit configured to receive a voltage from an external card reader without contact and to provide the received voltage as a contactless voltage; and
a smart card chip coupled to the matching circuit through a first power terminal and a second power terminal, wherein:

the smart card chip includes:
a connection terminal configured to receive a voltage in contact with the external card reader to provide a contact voltage;
an internal voltage generation circuit configured to generate a first driving voltage and a second driving voltage based on the contactless voltage in a contactless mode, and configured to generate the first driving voltage and the second driving voltage using the contact voltage based on a class according to a level of the contact voltage in a contact mode;
a fingerprint recognition sensor operating based on the first driving voltage, the fingerprint recognition sensor configured to generate a fingerprint image signal based on an input fingerprint; and
a processor operating based on the second driving voltage, the processor configured to perform the fingerprint authentication based on the fingerprint image signal,
wherein the internal voltage generation circuit includes a bi-directional voltage converter, the bi-directional voltage converter is connected between an input node and an output node, and the bi-directional voltage converter is configured to boost the first driving voltage stepwisely to generate the second driving voltage greater than the first driving voltage, by storing the second driving voltage applied to the output node, in a storage capacitor therein, and by providing the second driving voltage stored in the storage capacitor to the input node, in a boosting operation.

6. The smart card of claim 5, wherein the bi-directional voltage converter includes:
a gate driving circuit configured to generate first through fourth clock signals based on a first output signal, a second output signal, a first sub power-down signal and a second sub power-down signal, the first clock signal and the second clock signal having non-overlapping activation intervals with each other, and at least some of the first through fourth clock signals having non-overlapping activation intervals with one another;
a switching circuit including first through fourth switching elements connected in series between the input node and a ground voltage, the first through fourth switching elements configured to be switched in response to respective ones of the first through fourth clock signals, and configured to store the second driving voltage applied to an output node in the storage capacitor coupled, between a first node and a second node, in the boosting operation; and
a start-up circuit including a first start-up transistor and a second start-up transistor connected in series between the input node and the output node, the first start-up transistor and the second start-up transistor configured to be switched in response to a first delayed clock signal and a second delayed clock signal to provide the second driving voltage stored in the storage capacitor to the input node in the boosting operation, the first delayed clock signal and the second delayed clock signal having non-overlapping activation intervals with each other.

7. The smart card of claim 6, wherein:
the internal voltage generation circuit further includes:
a mode selector configured to output a first mode signal and a second mode signal, the first mode signal designating one of the contact mode and the contactless mode, the second mode signal designating one of sub-modes of the contact mode; and a control signal generator configured to generate a first power-down signal and a second power-down signal based on the first mode signal and the second mode signal, and the second power-down signal includes the first sub power-down signal and the second sub power-down signal.

8. The smart card of claim 7, wherein the bi-directional voltage converter further includes:
a dead time generator configured to generate the first output signal and the second output signal having non-overlapping activation intervals based on a reference clock signal; and
a delayed clock signal generator configured to generate the first delayed clock signal and the second delayed clock signal based on the first output signal, the second output signal and the second power-down signal.

9. A smart card configured to perform a fingerprint authentication, the smart card comprising:
a matching circuit configured to receive a voltage from an external card reader without contact and to provide the received voltage as a contactless voltage; and
a smart card chip coupled to the matching circuit through a first power terminal and a second power terminal, wherein:
the smart card chip includes:
a connection terminal configured to receive a voltage in contact with the external card reader to provide a contact voltage;
an internal voltage generation circuit configured to generate a first driving voltage and a second driving voltage based on the contactless voltage in a contactless mode, and configured to generate the first driving voltage and the second driving voltage using the contact voltage based on a class according to a level of the contact voltage in a contact mode, wherein the first driving voltage is different from the second driving voltage;
a fingerprint recognition sensor configured to receive the first driving voltage and operate based on the first driving voltage, the fingerprint recognition sensor configured to generate a fingerprint image signal based on an input fingerprint; and
a processor configured to receive the second driving voltage and operate based on the second driving voltage, the processor configured to perform the fingerprint authentication based on the fingerprint image signal,
wherein the internal voltage generation circuit includes a bi-directional voltage converter, the bi-directional voltage converter is connected between an input node and an output node, and the bi-directional voltage converter is configured to boost the first driving voltage step-wisely by storing the second driving voltage applied to the output node, in a storage capacitor therein, and by providing the second driving voltage stored in the storage capacitor to the input node, in a boosting operation.

10. The smart card of claim 9, wherein the bi-directional voltage converter includes:
a gate driving circuit configured to generate first through fourth clock signals based on a first output signal, a second output signal, a first sub power-down signal and a second sub power-down signal, the first clock signal and the second clock signal having non-overlapping activation intervals with each other, and at least some of the first through fourth clock signals having non-overlapping activation intervals with one another;
a switching circuit including first through fourth switching elements connected in series between the input node and a ground voltage, the first through fourth switching elements configured to be switched in response to respective ones of the first through fourth clock signals, and configured to store the second driving voltage applied to an output node in the storage capacitor coupled, between a first node and a second node, in the boosting operation; and
a start-up circuit including a first start-up transistor and a second start-up transistor connected in series between the input node and the output node, the first start-up transistor and the second start-up transistor configured to be switched in response to a first delayed clock signal and a second delayed clock signal to provide the second driving voltage stored in the storage capacitor to the input node in the boosting operation, the first delayed clock signal and the second delayed clock signal having non-overlapping activation intervals with each other.

11. The smart card of claim 10, wherein:
the internal voltage generation circuit further includes:
a mode selector configured to output a first mode signal and a second mode signal, the first mode signal designating one of the contact mode and the contactless mode, the second mode signal designating one of sub-modes of the contact mode; and
a control signal generator configured to generate a first power-down signal and a second power-down signal based on the first mode signal and the second mode signal, and
the second power-down signal includes the first sub power-down signal and the second sub power-down signal.

12. The smart card of claim 11, wherein the bi-directional voltage converter further includes:
a dead time generator configured to generate the first output signal and the second output signal having non-overlapping activation intervals based on a reference clock signal; and
a delayed clock signal generator configured to generate the first delayed clock signal and the second delayed clock signal based on the first output signal, the second output signal and the second power-down signal.

* * * * *